(12) United States Patent
Haick et al.

(10) Patent No.: US 10,886,125 B1
(45) Date of Patent: Jan. 5, 2021

(54) METHOD FOR MANUFACTURING A NANO-WIRE ARRAY AND A DEVICE THAT COMPRISES A NANO-WIRE ARRAY

(71) Applicant: Technion Research & Development Foundation, Technion (IL)

(72) Inventors: Hossam Haick, Haifa (IL); Ossama Assad, Yaffia (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 15/444,353

(22) Filed: Feb. 28, 2017

Related U.S. Application Data

(63) Continuation of application No. 13/747,558, filed on Jan. 23, 2013.

(60) Provisional application No. 61/592,614, filed on Jan. 31, 2012.

(51) Int. Cl.
*H01L 21/00* (2006.01)
*H01L 21/02* (2006.01)
*B82Y 40/00* (2011.01)
*H01L 29/786* (2006.01)

(52) U.S. Cl.
CPC .. *H01L 21/02603* (2013.01); *H01L 21/02532* (2013.01); *H01L 21/02628* (2013.01); *B82Y 40/00* (2013.01); *H01L 29/78696* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,606,501 | A * | 8/1986 | Bate | B05B 7/2429 239/346 |
| 2003/0092207 | A1 * | 5/2003 | Yaniv | B82Y 10/00 438/20 |
| 2005/0079659 | A1 * | 4/2005 | Duan | B82Y 10/00 438/197 |
| 2005/0221016 | A1 * | 10/2005 | Glatkowski | B82Y 30/00 427/444 |
| 2006/0226424 | A1 * | 10/2006 | Chae | B82Y 10/00 257/59 |
| 2007/0144431 | A1 * | 6/2007 | Lin | B82Y 10/00 118/313 |
| 2008/0152872 | A1 * | 6/2008 | Chabinyc | B82Y 10/00 428/195.1 |

\* cited by examiner

*Primary Examiner* — David P Turocy
*Assistant Examiner* — Mohammad Mayy
(74) *Attorney, Agent, or Firm* — Reches Patent

(57) ABSTRACT

A device having a nano-wire array and a method for manufacturing an array of nano-wires. The method includes spraying on a substrate droplets of a suspension that comprises nano-wires and at least a partially volatile solvent; and evaporating the at least partially volatile solvent of the droplets to form the array of nano-wires. At least one of the spraying and the evaporating comprises executing at least one aggregation reduction measure for limiting a formation of three dimensional aggregations of nano-wires on the substrate.

21 Claims, 21 Drawing Sheets

1910

1920

2010

METHOD FOR MANUFACTURING A NANO-WIRE ARRAY AND A DEVICE THAT COMPRISES A NANO-WIRE ARRAY

RELATED APPLICATIONS

This application claims the priority of U.S. patent application Ser. No. 13/747,558 filing date 23 Jan. 2013 which in turn claims the priority of U.S. provisional patent Ser. No. 61/592,614 filing date Jan. 31 2012 which is incorporated herein by reference.

BACKGROUND OF THE INVENTION

The ability of individual nano-wires (NWs) to carry electrical current makes them promising building blocks in various nanoelectronic device concepts. Individual NWs have been used to assemble a range of nanoscale devices, including p-n diodes, bipolar junction transistors, field effect transistors, biochemical sensors, optoelectronic devices, and more.

Nevertheless, there are still many challenges in realizing such devices: (i) difficulties in connecting the individual NW to the macroscopic world, although significant progress has been made in this field; (ii) fluctuations in the position of NWs between the adjacent metallic electrodes; (iii) understanding the mode of power dissipation when NWs are used as or in devices; and/or (iv) maintaining high signal to noise ratio in complex nano-devices. For technological applications, the ease and effectiveness with which NWs are assembled and integrated into large-scale devices are of critical importance.

Arrays of NWs can be achieved either by top-down or bottom-up fabrication techniques. The top-down approach depends heavily on multi-step (e-beam) lithography and lift-off techniques, which are serial, time-consuming and expensive. The bottom-up approach relies on the transfer of NW from the growth chip to the receiver substrates by, for example, random deposition, electric field directed assembly, flow assisted alignment, and up to centimeter-scale assembly of NWs using the LangmuirBlodgett technique.

A nano-tube film based approach was suggested that included using planar films of nano-tubes as a substrate for growing nano-wires. This technique is time consuming and is limited to the shapes of substrates that can receive the nano-wires.

There is a growing need to provide efficient methods for manufacturing nano-wire arrays and for devices that include nano-wire arrays.

SUMMARY

There can be provided a method for manufacturing an array of nano-wires. The method may include spraying on a substrate droplets of a suspension that comprises nano-wires and at least a partially volatile solvent; and evaporating the at least partially volatile solvent of the droplets to form the array of nano-wires; wherein at least one of the spraying and the evaporating comprises executing at least one aggregation reduction measure for limiting a formation of three dimensional aggregations of nano-wires on the substrate.

The spraying may include controlling the amount of nano-wires per droplet. Each droplet may include few nano-wires. For example, each droplet can include up to five, up to four, up to three, up to two or even only a single nano-wire.

The spraying may include introducing pressure on the suspension by a carrier gas to form the droplets.

The spraying may include introducing pressure on the suspension by a carrier gas to form the droplets and to induce a formation of an aligned nano-wire array.

The method may include spraying the suspension on the substrate while changing at least one parameter selected out of (a) a pressure applied during a coating of the area on droplets of the suspension, (b) a temperature of the substrate, (c) an angle of spraying the suspension and (d) a distance between locations of contact between the substrate and adjacent.

The method may include changing the at least one parameter to provide a nano-wire array having a varying alignment.

The method may include coupling different portions of the nano-wire array to different pairs of electrodes so that at least one pair of electrodes is coupled to a portion of the nano-wire array that differs by alignment from at least other pair of electrodes.

The method may include coupling different portions of the array to different pairs of electrodes so that at least one pair of electrodes is coupled to a portion of the nano-wire array that differs by density from at least other pair of electrodes.

The method may include changing the at least one parameter to provide a nano-wire array having a varying density.

The method may include adjusting the at least one parameter in response to feedback indicative of a difference between a desired value of a property of a nano-wire array formed by the spraying and an actual value of the property of the nano-wire array.

The method may include heating the substrate to a temperature that is closer to a boiling temperature of the volatile solvent than to an ambient temperature.

The method may include heating the substrate to a temperature that differs by up to twenty degrees to a boiling temperature of the volatile solvent.

The method may include heating the substrate to a temperature that substantially equals to a boiling temperature of the volatile solvent.

The method may include heating the substrate to a temperature that guarantees that most droplets evaporate before nano-wires of different droplets contact each other.

The method may include cooling the substrate to a temperature that causes droplets to freeze as a result of contacting the substrate to form a frozen formation of droplets on the substrate; and causing the frozen formation of droplets to evaporate.

The method may include causing the frozen formation of droplets to evaporate while maintaining a location of the nano-wires substantially unchanged.

The method may include coating at least one surface of the substrate that forms a three-dimensional shape.

The spraying may include coating an entire substrate that includes at least one surface of the substrate that forms a three-dimensional shape.

The substrate may have an edge and the spraying may include coating the edge and areas of the substrate that form the edge with a uniform array of nano-wires.

The substrate may have an irregularity point and wherein the method may include providing a uniform nano-wire coverage of the at least one irregularity point and a vicinity of the at least one irregularity point.

The substrate may exhibit a macro-scale roughness and wherein the method may include providing uniform nano-wire coverage of the substrate.

The evaporating may include removing the entire solvent to provide a direct contact between the nano-wire-array and the substrate.

The method may provide an array of nano-wires that is a three-dimensional array of nano-wires.

The method may include forming the three-dimensional array of nano-wires so that the three-dimensional array of nano-wires may include multiple repetitions of a same two-dimensional nano-wire array.

The method may include forming the three-dimensional array of nano-wires so that the three-dimensional array of nano-wires may include multiple two-dimensional nano-wire arrays, wherein at least two two-dimensional nano-wire arrays differ from each other by shape or orientation.

The method may include forming the three-dimensional array of nano-wires so that the three-dimensional array of nano-wires may include multiple two-dimensional nano-wire arrays, wherein at least one two-dimensional nano-wire array exhibits uneven alignment or density.

The method may include forming the three-dimensional array of nano-wires on at least one surface of the substrate that forms a three-dimensional shape.

There may be provided a method for manufacturing an array of nano-wires, the method may include: spraying on a substrate droplets of a suspension that may include nano-wires and an at least partially volatile solvent; and at least partially evaporating the at least partially volatile solvent of the droplets to form the array of nano-wires; wherein at least one of the spraying and the causing may include reducing a formation of three dimensional aggregations of nano-wires on the substrate.

There can be provided a system that may include a spraying module arranged to spray on a substrate droplets of a suspension that may include nano-wires and a volatile solvent while reducing a formation of three dimensional aggregations of nano-wires on the substrate; and a substrate managing element arranged to support the substrate; wherein once the volatile solvent of the droplets evaporate a the array of nano-wires is formed on the substrate.

There can be provided a system that is arranged to apply any method or any combination of method stages illustrated in this specification.

A device may be provided and may include a substrate and a nano-wire array that contacts at least one surface of the substrate; wherein the nano-wire array may include different portions that differ from each other by at least one of (a) an amount of alignment between the nano-wires, and (b) a density of nano-wires.

The device can be a sensor, can include a sensor, can include one or more transistors or logical gates that in turn comprise nano-wires.

The nano-wire array may directly contact the substrate without any residue between the nano-wire-array and the substrate.

Each portion of the nano-wire array may be coupled between a pair of electrodes, wherein at least two portions of the nano-wire array are coupled between different electrodes.

At least two portions of the nano-wire array differ from each other by density of the nano-wires.

At least two portions of the nano-wire array differ from each other by alignment of the nano-wires.

Each portion of the nano-wire array can be coupled between a pair of electrodes, wherein at least two portions of the nano-wire array are coupled between different electrodes.

At least one surface of the substrate may form a three-dimensional shape.

The nano-wire array may cover the entire substrate.

At least one surface of the substrate may define an edge and wherein the edge and areas of the substrate that form the edge are coated with nano-wires that maintain uniformity of alignment across the edge.

At least one surface of the substrate may define an edge and the edge and areas of the substrate that form the edge are coated with nano-wires that maintain uniformity of density across the edge.

The at least one surface of the substrate may have an irregularity point that is coated with nano-wires that maintain uniformity across the irregularity point.

The at least one surface of the substrate have an irregularity point that is coated with nano-wires that maintain density across the irregularity point.

The at least one surface of the substrate exhibit a macro-scale roughness and wherein uniformity of alignment of the nano-wire array remains unchanged despite the macro-scale roughness.

The substrate may exhibit a macro-scale roughness and wherein density of the nano-wire array remains unchanged despite the macro-scale roughness.

The device array of nano-wires may be a three-dimensional array that may include multiple repetitions of a same two-dimensional nano-wire array.

The array of nano-wires may be a three-dimensional array that may include multiple two-dimensional nano-wire arrays; wherein at least two two-dimensional nano-wire arrays differ from each other by shape or orientation.

The at least one surface of the substrate may define a three-dimensional shape and wherein the array of nano-wires is a three-dimensional array of nano-wires.

A device may be provided and may include a substrate and a nano-wire array that contacts at least one surface of the substrate that form a three-dimensional shape; wherein the nano-wire array may covers the entire substrate.

The at least one surface of the substrate may define an edge and wherein the edge and areas of the substrate that form the edge are coated with nano-wires that maintain uniformity of alignment across the edge.

At least one surface of the substrate may define an edge and the edge and areas of the substrate that form the edge are coated with nano-wires that maintain uniformity of density across the edge.

The at least one surface of the substrate may have an irregularity point that is coated with nano-wires that maintain uniformity across the irregularity point.

The at least one surface of the substrate may have an irregularity point that is coated with nano-wires that maintain density across the irregularity point.

The at least one surface of the substrate may exhibit a macro-scale roughness and wherein uniformity of alignment of the nano-wire array remains unchanged despite the macro-scale roughness.

The substrate may exhibit a macro-scale roughness and wherein density of the nano-wire array remains unchanged despite the macro-scale roughness.

There can be provided a device that includes a substrate and an array of nano-wires that is a three-dimensional array.

The array of nano-wires can be a three-dimensional array that may include multiple repetitions of a same two-dimensional nano-wire array.

The array of nano-wires can be a three-dimensional array that may include multiple two-dimensional nano-wire arrays; wherein at least two two-dimensional nano-wire arrays differ from each other by shape or orientation.

There can be provided a device that may include a substrate and a nano-wire array that contacts at least one surface of the substrate that form a three-dimensional shape; wherein the at least one surface of the substrate define an edge and wherein the edge and areas of the substrate that form the edge are coated with nano-wires that maintain uniformity of alignment across the edge.

There can be provided a device that may include a substrate and a nano-wire array that contacts at least one surface of the substrate that form a three-dimensional shape; wherein the at least one surface of the substrate define an edge and the edge and areas of the substrate that form the edge are coated with nano-wires that maintain uniformity of density across the edge.

There can be provided a device that may include a substrate and a nano-wire array that contacts at least one surface of the substrate that form a three-dimensional shape; wherein the at least one surface of the substrate have an irregularity point that is coated with nano-wires that maintain uniformity across the irregularity point.

There can be provided a device that may include a substrate and a nano-wire array that contacts at least one surface of the substrate that form a three-dimensional shape; wherein the at least one surface of the substrate have an irregularity point that is coated with nano-wires that maintain density across the irregularity point.

There can be provided a device that may include a substrate and a nano-wire array that contacts at least one surface of the substrate that form a three-dimensional shape; wherein the at least one surface of the substrate exhibit a macro-scale roughness and wherein uniformity of alignment of the nano-wire array remains unchanged despite the macro-scale roughness There can be provided a device that may include a substrate and a nano-wire array that contacts at least one surface of the substrate that form a three-dimensional shape; wherein the substrate exhibits a macro-scale roughness and wherein density of the nano-wire array remains unchanged despite the macro-scale roughness.

There can be provided a device that may include a substrate and a three-dimensional nano-wire array that contacts at least one surface of the substrate; wherein nano-wires of different layer of the three-dimensional nano-wire array contact each other by direct contact; wherein the three-dimensional nano-wire array is substantially free from materials that differ from nano-wire materials.

There can be provided a device that may include a substrate and a nano-wire array that may be manufactured by any of the methods illustrated in the specification.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 18A-18F illustrate various electrical characteristics of devices manufactured by spray coating Si NWs arrays with a density of about 1 nanowire per a square micron (1 NW/$\mu m^2$) according to an embodiment of the invention;

Figure 1:
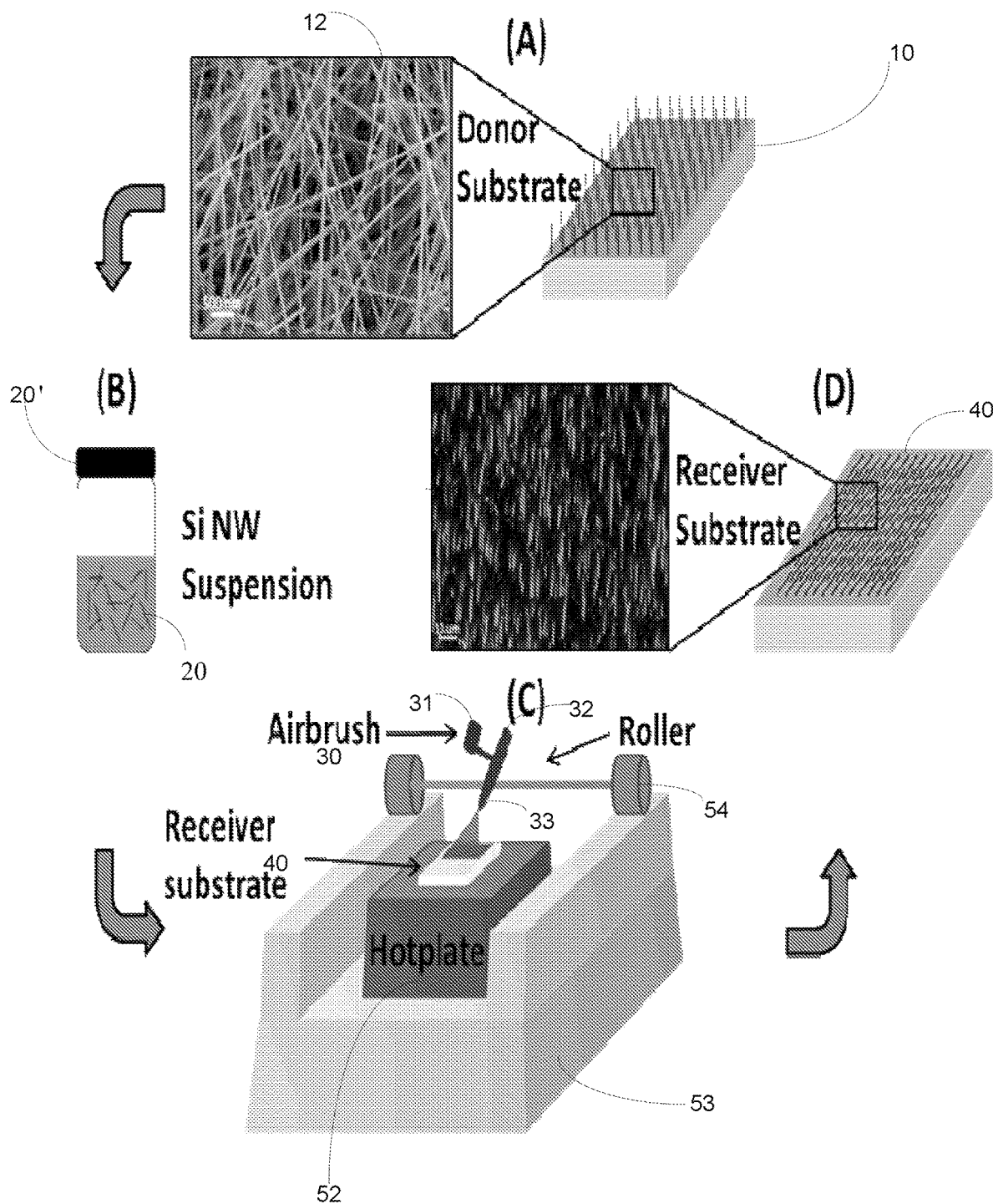
FIG. 1 illustrates a system and a method according to various embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Technological implementation of nano-wires (NWs) requires these components to be organized with controlled orientation and density over various substrates. There is provided a simple and efficient route for the deposition of highly ordered and aligned NW arrays on a wide range of receiver substrates, including silicon, glass, metals and flexible plastics.

As a representative example, the following text will focus on Si NWs. It is noted that devices, systems and methods are not limited to Silicone NW but can be applicable to nano-wires made from other materials or from additional materials.

The deposition approach is based on spray coating of (Si) NW suspension under controlled conditions of the nozzle flow, spray angle and the temperature of a receiver substrate (substrate). Process parameters that affect the density and/or alignment of the deposited Si NW arrays are presented and discussed. The quality and reproducibility of the spray-coated Si NW arrays is illustrated by the production of highly uniform Si NW field effect transistors.

The parameters of the spray coating process are explored through a series of systematic studies that has enabled us to gain further control over the NW deposition. Representative applications of these films are reported.

The investigated Si NWs can be prepared by the vapor-liquid-solid (VLS) growth technique using gold nanoparticles as a catalysts under a constant flow of silane (4 s.c.c.m.), argon (5 s.c.c.m.) and diborane (100 ppm in He, 1 s.c.c.m.), yielding p-type Si NW.
ENREF 37

Scanning electron microscopy (SEM) data indicated that these Si NWs consisted almost entirely of smooth crystalline core (40±8 nm in diameter) with a length ranging between 7 μm and 10 μm. This is illustrated in image 12 of FIG. 1.

FIG. 1 also illustrates a donor substrate 10, a container 20' for forming and storing a suspension 20 that include nano-wires and an at least partially volatile solvent, a spraying module 30, and a substrate managing element 50. FIG. 1 also illustrates a substrate 40 on which the nano-wire structure is formed.

The substrate managing module 50 can support the substrate 40. Additionally or alternatively, the substrate managing module 50 can move the substrate 40 in relation to the spraying module 30. It is noted that the spraying module 30 can be moved in relation to the substrate 40 (As illustrated in FIG. 1). The relative movement between the substrate 40 and the spraying module 30 can allow spraying on different areas of the substrate. According to various embodiments of the invention the spraying module and/or the substrate 40 can move in relation to each other in various manners including rotation, three-dimensional movements and the like.

The substrate managing module 50 can heat (or cool) the substrate 40 via hotplate 52. Hotplate 52 is supported on base 53. Roller 54 rolls along the top facets of base 53.

FIG. 1 illustrates the spraying module 30 as including a first inlet 31 for receiving the suspension, a second inlet 32 for receiving a pressurized gas and a nozzle 33 through which the droplets of the suspension exit. These elements can belong to an airbrush or other spraying element. FIG. 1 also illustrates a roller 54 for introducing a linear movement between the substrate 40 and the nozzle 33. FIG. 1 does not show (for brevity of explanation) a pressurized gas supply module that feeds the pressurized gas to the airbrush. The pressurized gas supply module can adjust the pressure applied on the gas. It is further noted that the system can include a camera or other image sensor for imaging the nano-wire array, a heating module for generating a heat pulse that will cause frozen droplets to evaporate, and the like.

Devices that are based on Si NW arrays were fabricated on 300 nm thermal oxide coated heavily doped p-type silicon wafer (<0.005 ohm-cm, silicon materials). Prior to the device fabrication, the top $SiO_2$ surface was cleaned with ultrasonic treatment in acetone, methanol, and isopropyl alcohol and slightly etched using oxygen plasma (100 W and 200 sccm $O_2$ for 1min) for removing (residues of) organic contaminations. This process was followed by a deposition of NW array, as described below.

Unless otherwise stated, Si NW arrays were produced by means of spray coating in a three-part process. First, the Si NW suspension 20 is prepared by harvesting the Si NWs from the VLS growth substrate 10 and suspending them in isopropyl alcohol using an ultrasonic water bath for 5-7 sec. The second part of the process is the "receiver" substrate 40, which was cleaned and etched using oxygen plasma (100 W and 200 sccm O2 for 1 min). For the sake of comparison, silicon wafers were chemically modified by well-established siloxane-based condensation chemistry of various compounds including trichloro(octadecyl)silane (Sigma-Aldrich, Inc.), (3-Aminopropyl)trimethoxysilane (Sigma-Aldrich, Inc.), (2-(perfluorooctyl)ethyl)trichlorosilane (ABCR, Inc.) to define —CH3, —NH2, or —CF3 terminated surfaces, respectively. To carry out the reactions, solutions of ~5 mmolar of the above compounds were prepared with either chloroform or toluene as the solvent. Si substrates 10 were treated with oxygen plasma for 30 min and then reacted with the respective solutions for 45 min, followed by cleaning treatment with the solvent using ultrasonic bath and baking at 100° C. for 2 hours. The receiver substrate was placed on a hotplate at 75° C., where it receives the deposited Si NW. The third part involves the spray coating system 30 (Spray gun, Prona R2-F), which was aligned within 5±2° of the "receiver" substrate 40 direction, filled with the Si NW suspension. To align the Si NWs onto the receiver substrate, a 40 psi carrier gas (nitrogen) 32 is passed through the NW suspension before it comes out of a nozzle 33 that is saturated with NW solution. The nozzle tip is usually held at a distance of 1 cm from the substrate 40. For the sake of comparison, Si NW suspensions were applied by drop-casting and spin-coating.

In the drop-casting method, 20 µL aliquots (10 drops in total) of Si NW suspension is applied to a receiver substrate, maintained at 25° C., 80° C. or 130° C. The NW solvent is then allowed to evaporate.

In the spin-coating method, 200 µL of solution was applied on the receiver substrate 40 and spun at a controlled speed. For the current study, the Si NW suspension was deposited on receiver substrates at different spin speeds (200, 600, and 1000 rpm) for 1 min.

Interdigitated electrodes (not shown in FIG. 1) were defined using photolithography (Karl Suss MA6 Mask Aligner) and metal evaporation (Ti/Au, 40/110 nm) on top of the sprayed Si NW array.

The native oxide on NW under contact is etched by BHF for 5 s immediately before being loaded into the metal deposition system. The width of the electrodes was 5 µm and the gap between the source and the drain electrodes was 2 µm.

Images of Si NWs after deposition were obtained by a scanning electron microscope (e-LiNE, Raith, Dortmund, Germany) and by an optical microscope (Olympus BX51RF-5) that is equipped with a camera (Olympus CAM-LC20-Bundle).

An Agilent B1500A Semiconductor Device Analyzer was used for electrical measurements. To assess the electrical characteristics of Si NW field effect transistors (FETs), two modes of voltage-dependent back-gate measurements were performed. In the first mode, voltages between −40 V and +40 V, in steps of 10 V, were applied to the degenerately doped silicon substrate. For each gate voltage, the current-voltage (I-V) characteristics were measured between the two electrodes, i.e., between the drain (d) and source (s), contacted by a micromanipulator, at a bias range between 0 V and +2 V, in steps of 50 mV, under ambient conditions. In the second mode, voltages of 2 V were applied between the two electrodes and the current-back gate voltage (I-$V_g$) measurements were carried out using a sweeping voltage from −40 V upward to +40 V, in steps of 200 mV, under ambient conditions.

The spray coating of Si NW suspension utilizes a stream of fast moving nitrogen gas. The high velocity of the nitrogen atomizes the sprayable material (i.e., Si NW suspension) and induces a shear flow on the Si NW deposited droplets which reorient and aligns the Si NWs parallel to the flow direction.

Figure 2A:
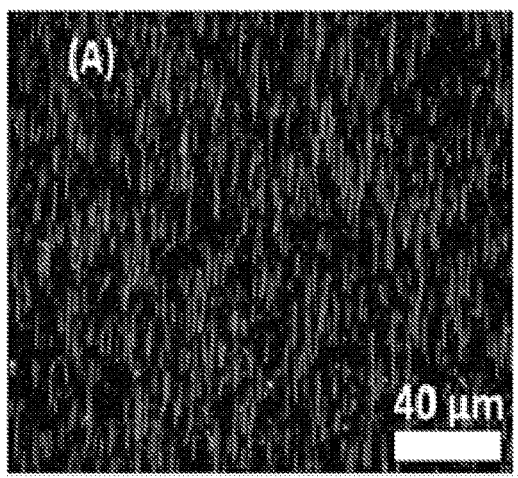
FIGS. 2A-2E illustrate a nano-wire array, an alignment measure of a nano-wire array and the relationship between various manufacturing properties and alignment of nano-wire arrays according to various embodiments of the invention.
Figure 2B:
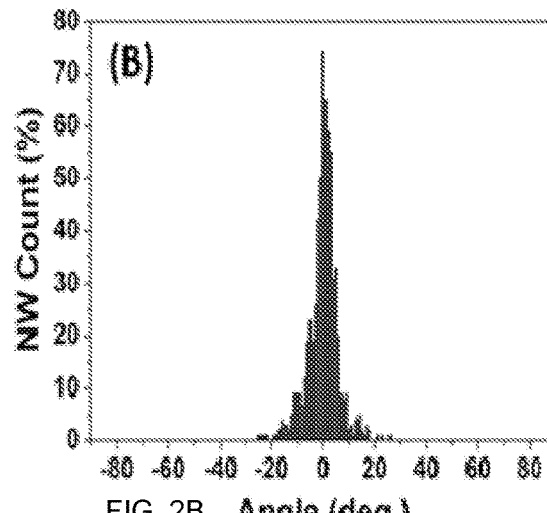
Figure 2C:
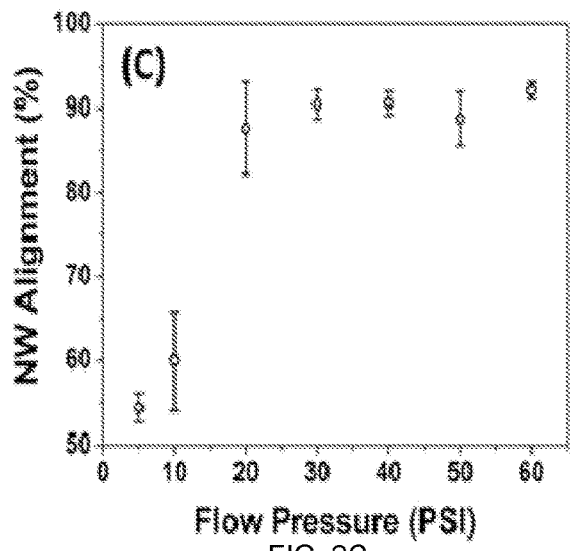
Figure 2D:
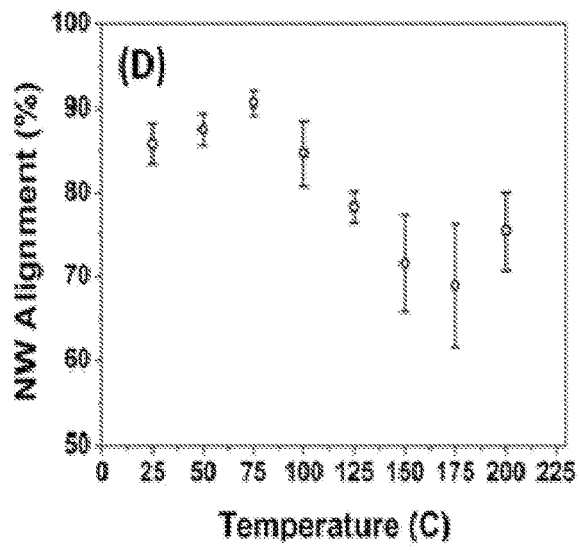
Figure 2E:
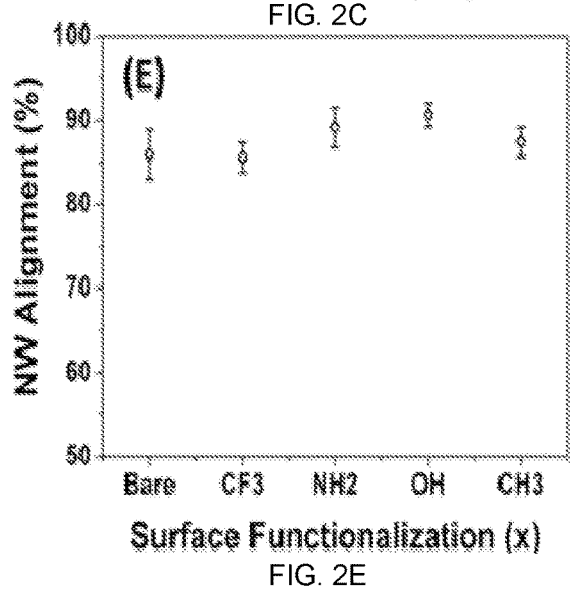

FIGS. 1A-2E illustrates spray coating of Si NWs. FIG. 2A is a dark-field optical image of assembled NWs. FIG. 2B provides a statistical analysis of angular distribution of ~700 Si NWs, with respect to the flow direction. FIG. 2C illustrates the percentage of the aligned nano-wires on the receiver substrate for various spray flow pressure; 5, 10, 20, 30, 40, 50 and 60 psi. All experiments were carried out at 75° C. of the receiver substrate. FIG. 2D illustrates the percentage of the aligned nano-wires versus the temperature of the receiver substrate; T=25, 50, 75, 100, 125, 150, 175 and 200° C. All experiments were carried out with an air pressure of 40 psi. FIG. 2E illustrates the percentage of the aligned nano-wires as a function of the surface functionalization of the receiver substrate. Bare SiO2 corresponds to using the untreated substrate and OH corresponds to plasma treated substrate while —CH3 (trichloro(octadecyl)silane), —NH2 ((3-Aminopropyl)trimethoxysilane), and —CF3 ((2-(perfluorooctyl)ethyl)trichlorosilane) correspond to the surface modified functional groups.

Each point in FIGS. 2C-2E was obtained by statistical analysis of angular distribution of ~200 Si NWs. A nano-wire is considered misaligned if its axis forms an angle >10° with respect to the spray direction.

Figure 3A:
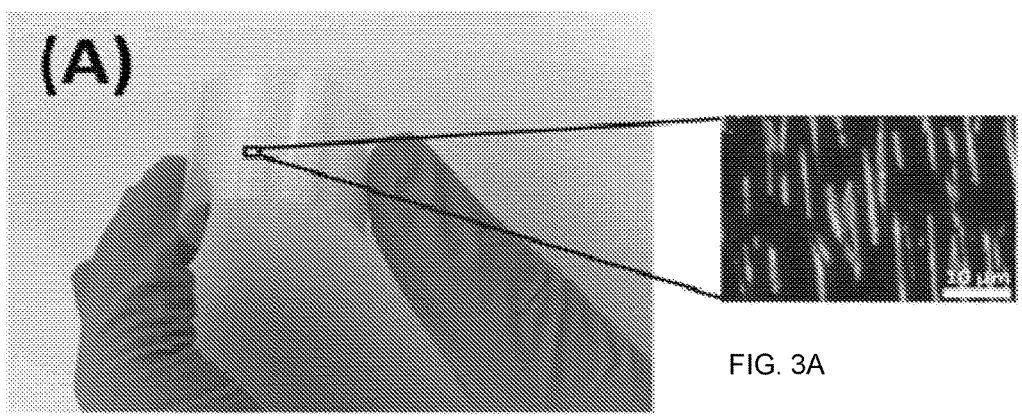
FIGS. 3A-3C include various images of nano-wires during the manufacturing process according to an embodiment of the invention.
Figure 3B:
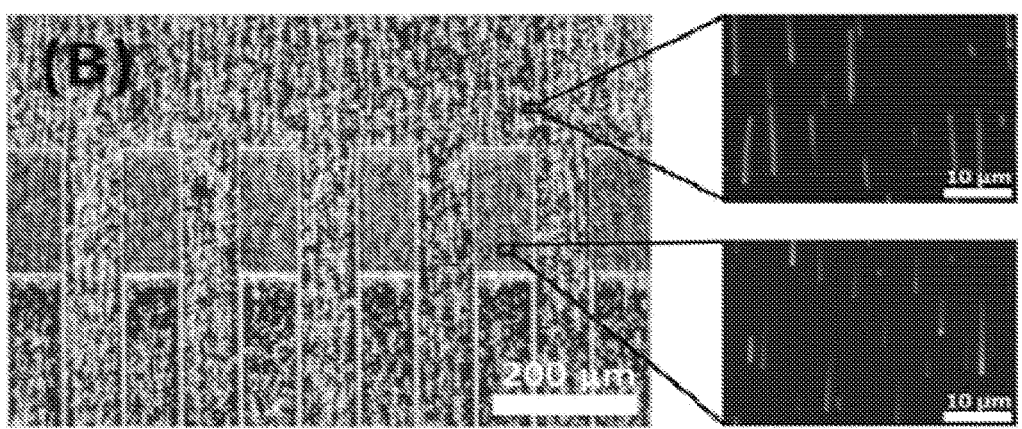
Figure 3C:
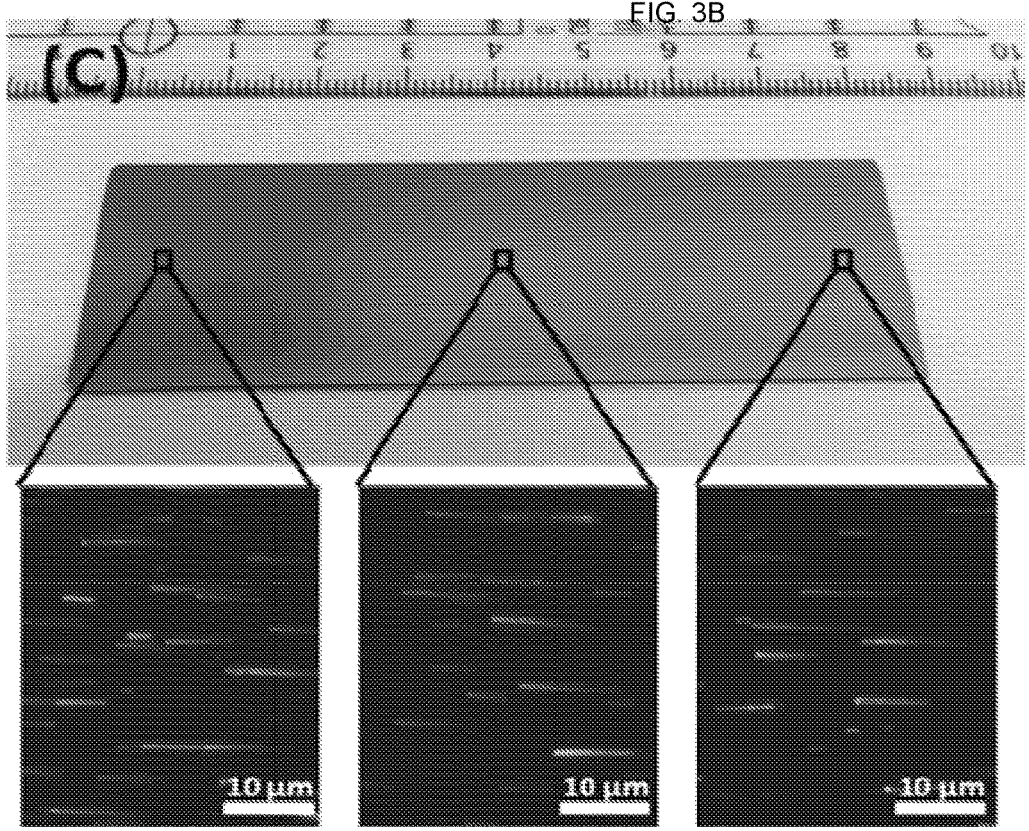
Figure 4A:
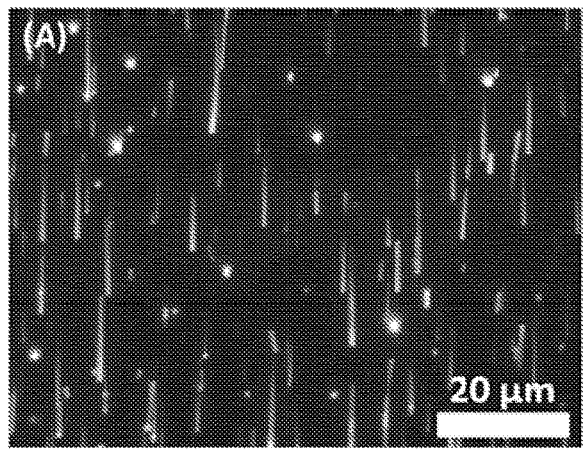
FIGS. 4A-4F include various images of nano-wire arrays according to an embodiment of the invention.
Figure 4B:
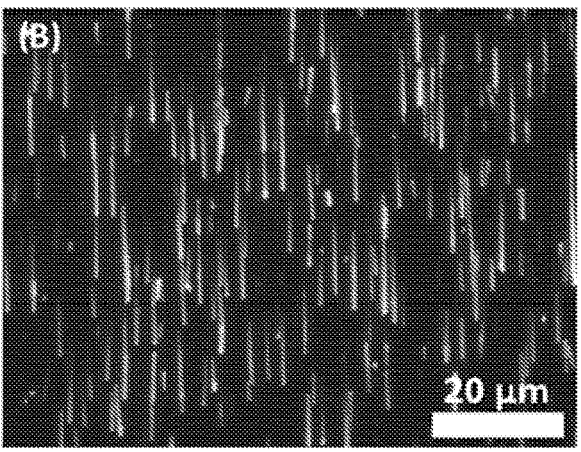
Figure 4C:
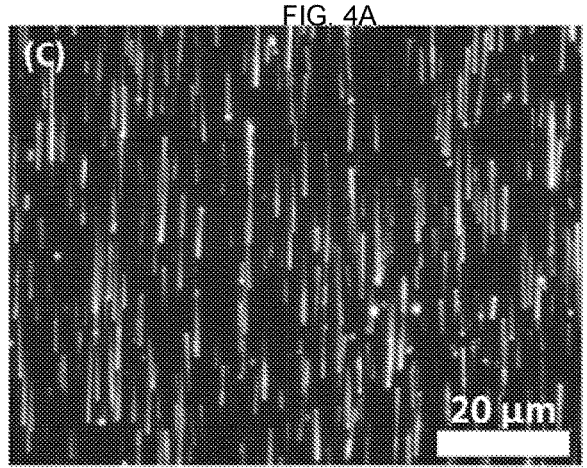
Figure 4D:
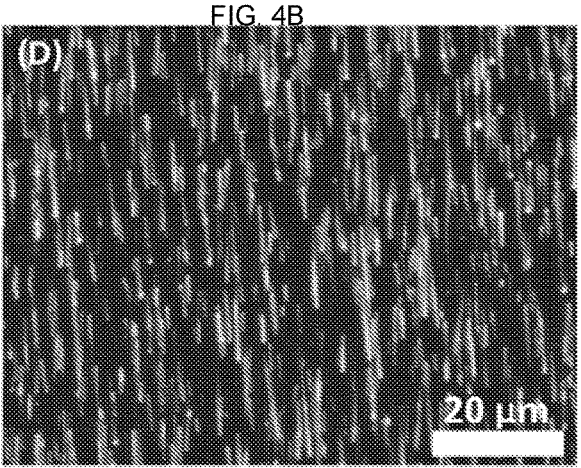
Figure 4E:
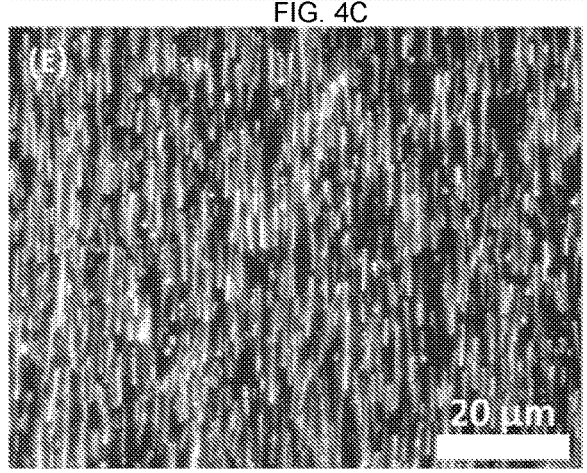
Figure 4F:
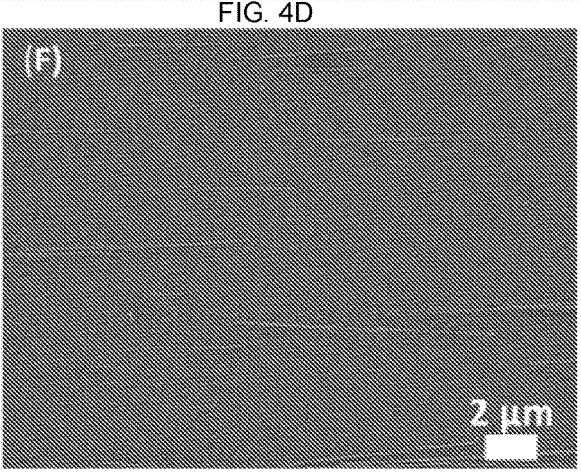

FIGS. 3A-3C are images of aligned Si NW by the spray flow. FIG. 3A is an image of a Si NW transferred to a plastic substrate. Inset, dark-field optical image showing Si NWs in the film. The black rectangle highlights the examined location. FIG. 3B is an image of Si NW transferred to predefined locations on a Si/SiO2 substrate. Inset, dark-field optical image showing Si NWs in different parts of the pattern. The black rectangle in the main panel highlights the examined location.

FIG. 3C is an image of SiNW transferred to an 80-mm Si wafer and its line-scanning alignment analysis. Insets: high-resolution dark-field images highlighting the alignment of Si NWs in the marked locations (triangles indicate recorded locations).

FIGS. 2A-4E are optical and scanning electron microscopy images of Si NW aligned by the spray flow for different durations: 5 sec (4A); 10 sec (4B), 20 sec (4C), 30 sec (4D), 60 sec (4E) and 30 sec (4F). All experiments were carried out with an air pressure of 40 psi.

A dark-field optical image 211 of assembled Si NWs on a Si/SiO2 receiver substrate is shown in FIG. 2A, clearly demonstrating the well-aligned NW arrays along one direction, i.e., the flow direction. A histogram (FIG. 2B) of angle distribution of over 700 Si NWs shows that more than 90% of the Si NWs were aligned within ±10° of the flow direction. The rest were distributed between ca. −30° to +30° with respect to the flow direction.

There were carried out several types of experiments to understand factors controlling the alignment and average separation between the adjacent (deposited) Si NWs.

First, it was found that the alignment degree of the deposited Si NWs was affected by the pressure of the carrier gas introduced into the Spray gun. The higher the carrier gas pressure in the range between 5-20 psi, the higher the alignment of the Si NW with respect to the flow direction. This is illustrates in graph 213 of FIG. 2C. For a carrier gas pressure in the range of 20-60 psi, the Si NWs showed maximum alignment with respect to the flow direction. More than 87% of the NWs are aligned within 10° of the flow direction.

Second, the alignment degree of the deposited Si NWs with respect to the flow direction was also affected by the temperature of the receiver substrate. Increasing the temperature of the receiver substrate to a value that is close to the boiling point of the suspension's solvent (Isopropyl alcohol; Tboiling 80° C.) exhibited excellent alignment and higher reproducibility from sample-to-sample with respect to the flow direction. This is illustrates in graph 214 of FIG. 2D.

For example, at 75° C. of the receiver substrate, ca. 90% of the Si NWs were aligned within ±10° of the flow direction. Higher temperatures of the receiver substrate affected the uniformity of the Si NWs alignment adversely; the Si NWs exhibited a high degree of distribution with respect to the flow direction, to some extent, as a random distribution. For example, at 150° C. of the receiver substrate, only ca. 70% of the Si NWs were aligned within ±10° of the flow direction. The rest were distributed between ca. −60° to +60° with respect to the flow direction Finally, we explored the role of surface chemical modification of the receiver substrate on the alignment of the assembled NWs. Graph 215 of FIG. 2E shows the alignment of the deposited Si NW suspension (chemically unmodified, d~50 nm) on chemically modified SiO2 receiver substrates with various siloxane monolayers. The alignment degree of the deposited Si NWs was almost not affected by the different terminated monolayers. However fluorinated surfaces are well-known to be highly hydrophobic and "non-sticky", therefore minimizing the adhesion of NWs to the receiver substrate. On the other hand, —NH2 terminated surfaces interact effectively with the NW surface through strong bonding interactions. This demonstrates that our assembly process do not require NW to receiver substrate interactions, and is compatible with wide range of receiver substrates, irrespective of the substrate type.

The spray coating process was found to be compatible with a wide range of rigid and flexible substrates, irrespective of the substrate type. For example, a Si NW was transferred to silicon, glass and metal substrates (as illustrated in FIGS. 3A-3C), subsequent darkfield optical images confirm that the NWs within the film are well aligned. We also show that NWs can be transferred to flexible plastic substrates that are subsequently bent into curved structures (FIG. 3A).

In addition to planar and curved substrates, NWs have been transferred to predefined locations on the substrate with good orientational alignment of the NW (FIG. 3B), thus demonstrating the great flexibility of this approach. Importantly, our approach has the potential to be scaled to structures of very large area. A representative image of Si NWs transferred to an 80-mm wafer (FIG. 3C). It is shown that the film is remarkably uniform given the unsophisticated transfer process. Moreover, dark-field optical images demonstrate that the Si NWs have the same orientation and uniform separation across the diameter of this large substrate, with good control of the Si NW alignment and density. A histogram of angle distribution of over 500 Si NWs taken from different locations over the entire substrate, shows that more than 85% of the NWs are aligned within 10 of the flow direction.

The density of the Si NWs was easily controlled by either the concentration of the Si NW suspension or by the flow duration. Experiments carried out at a constant carrier gas pressure (40 psi), with 75° C. as the temperature of the receiver substrate, showed that the Si NW density increased systematically with the flow duration time, as illustrated by images 401-406 of FIGS. 4A-4E. In these experiments, 60 sec flow duration produced a density of 200 Si NW per 100 µm, with an average NW-NW separation of 500 nm.

Extended deposition time (~90 sec) produced Si NW arrays with spacing on the order of 200 nm or less. For the sake of comparison, Si NW suspensions were deposited by drop-casting and spin-coating methods. Si NWs that were drop-casted at 25° C. were randomly aggregated on the surface, forming 3D (Si NW) islands. The higher the drop-casted volume and/or concentration of the suspension, the larger the dimensions of the 3D (Si NW) islands and the closer the distances between the adjacent islands. Increasing the temperature of the receiver substrate decreased the aggregation of the drop-casted Si NWs partially, most probably because of the faster evaporation and, subsequently, the shorter NW-NW interaction time. The reproducibility of all drop-casted Si NW samples from sample-to-sample and from batch-to-batch was significantly (5 to 8 times) lower than equivalent samples prepared by the spray-coating technique. Si NWs that were spin-coated at 25° C. exhibited random distribution and low density of Si NWs on the receiver substrate.

The higher was the spin velocity the lower was the NW density. For example, devices that were prepared by spin coating at 200 rpm showed an average NW-NW separation of ~20 µm (FIGS. 5A-5F), at the time spin-coating at 600 rpm resulted in a NW-NW separation of 300 µm (not shown).

Figure 5A:
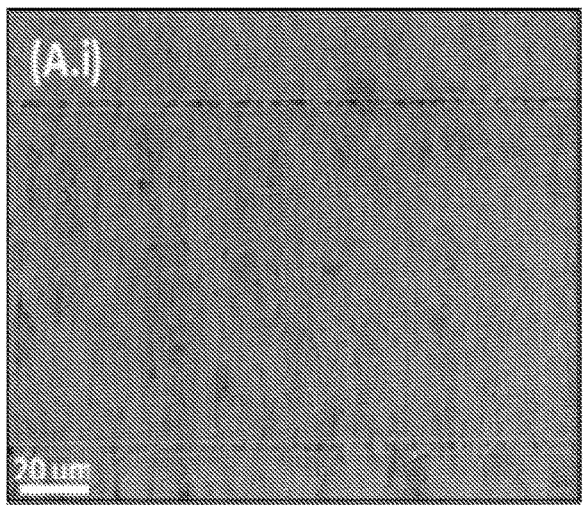
FIGS. 5A-5F include various images of nano-wire arrays according to an embodiment of the invention.
Figure 5D:
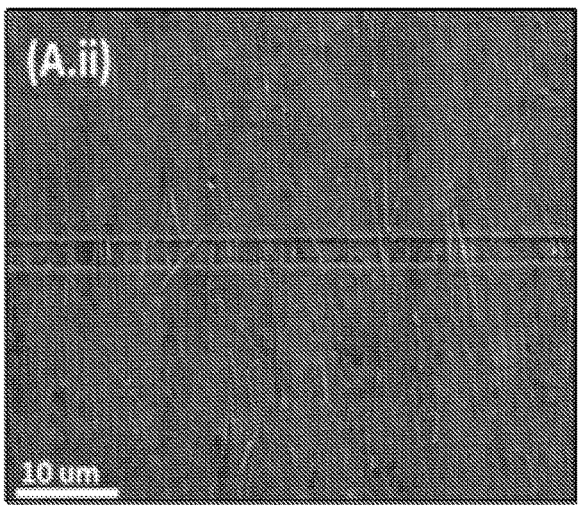
Figure 5B:
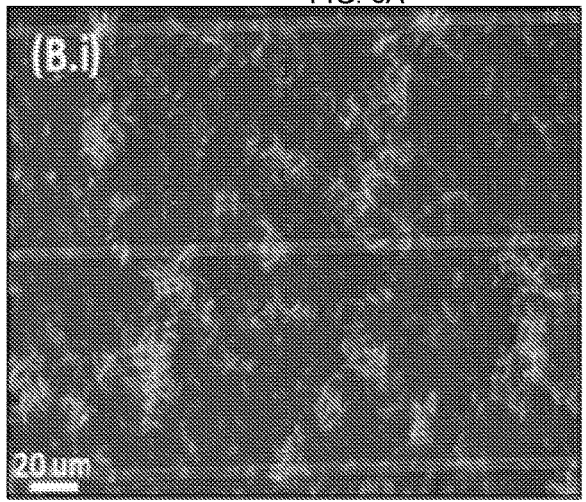
Figure 5E:
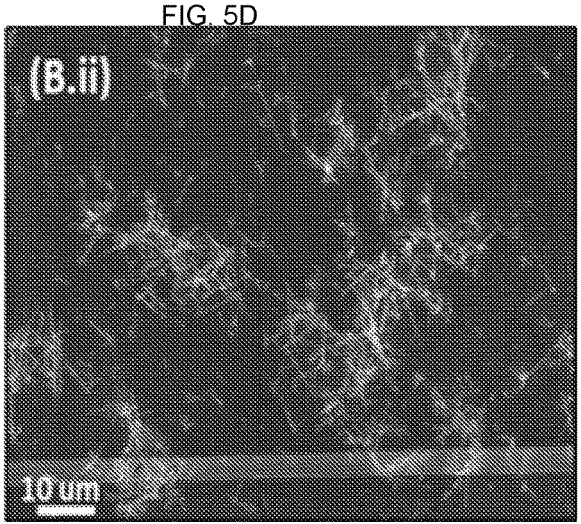
Figure 5C:
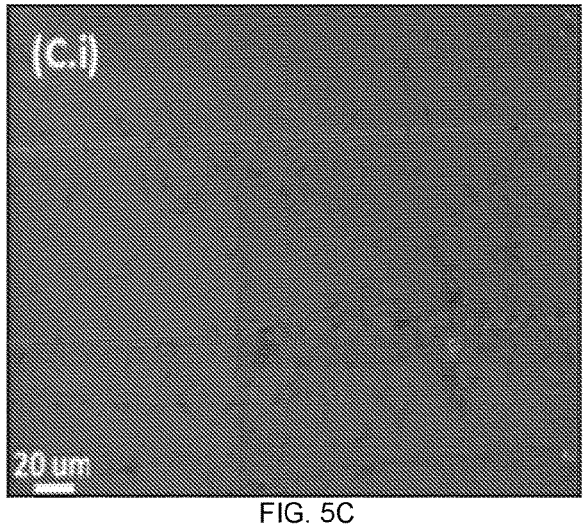
Figure 5F:
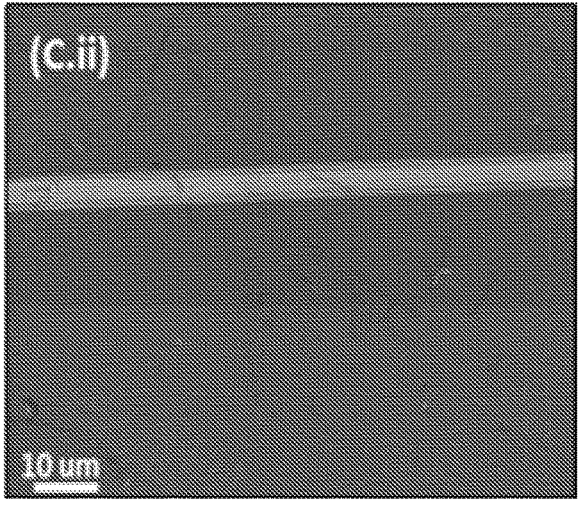

FIG. 5A-5F are scanning electron microscopy (SEM) images of devices based on arrays of nano-wires produced by (FIG. 5A) spray coating, (FIG. 5B) drop casting, and (FIG. 5C) spin coating. FIGS. 5D-5F show a magnification of the area between the electrodes shown in FIGS. 5A-5C, respectively.

While these characteristics make spin-coating advantageous compared to drop-casting, spin-coating is still considered inferior to the spray-coating method. This is because spin-coating has fundamental limitations to finely and/or uniformly align the Si NWs on the surface, especially when medium-high dense Si NW films are targeted.

The high degree of alignment and controlled density of Si NWs is important in a number of integrated electronic devices as well as in their constituent applications. To illustrate this potential, we have fabricated and characterized FET devices, with spray-coated Si NWs as a channel between the source and drain electrodes.

Figure 6A:
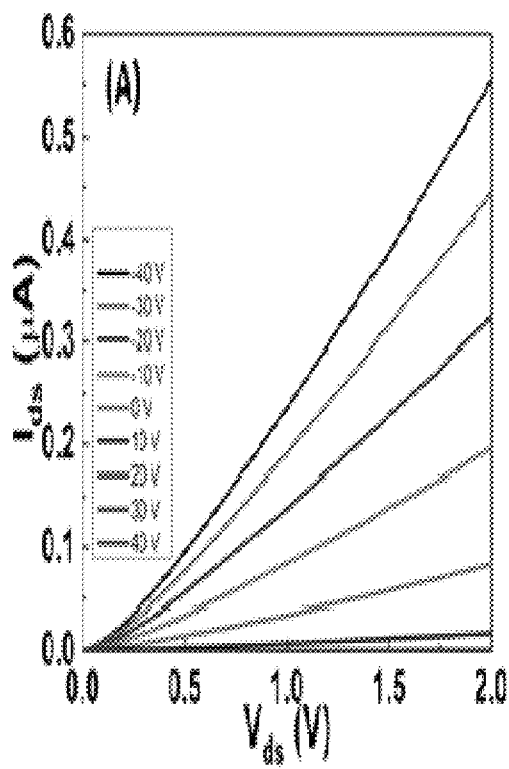
FIGS. 6A-6D illustrate various parameters of transistors that include nano-wire arrays according to an embodiment of the invention.
Figure 6B:
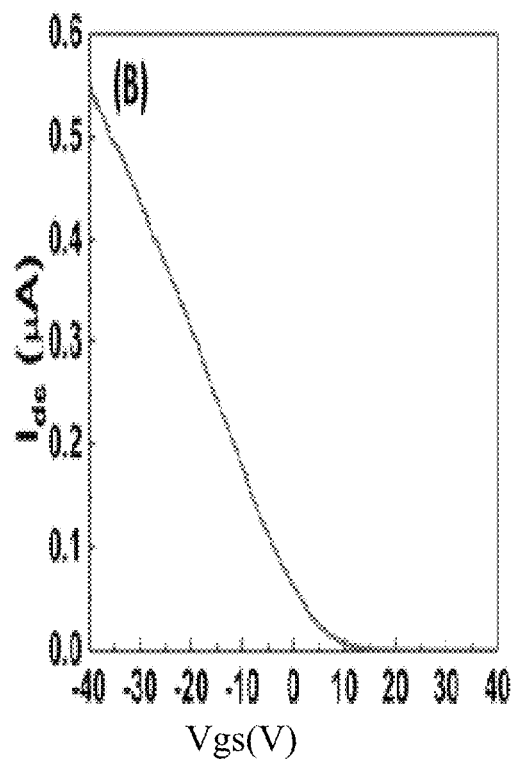
Figure 6C:
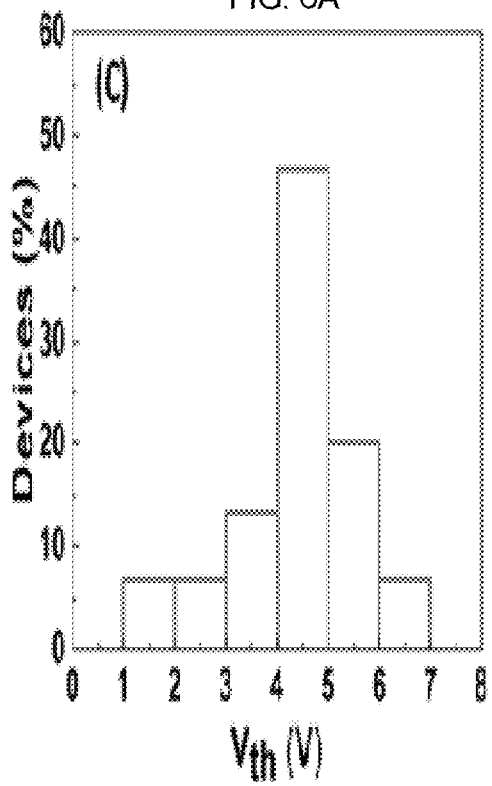
Figure 6D:
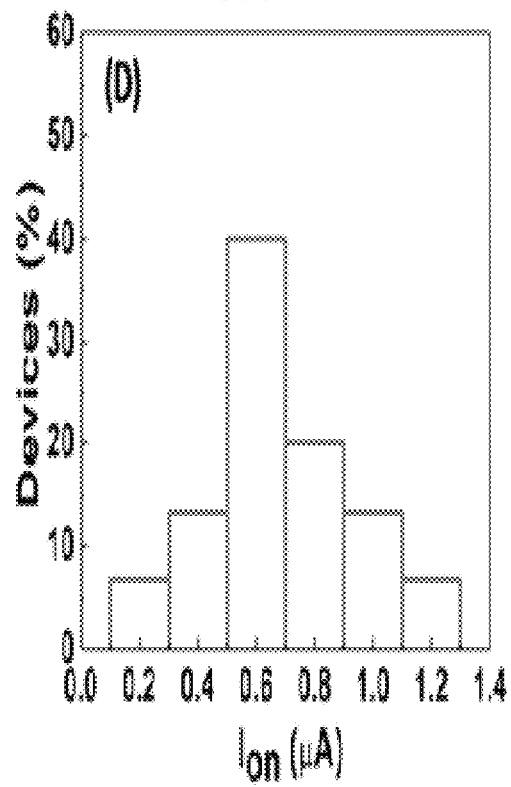

FIG. 6A illustrates a Family of source-drain current ($I_{sd}$) vs. source-drain voltage ($V_{sd}$) plots at different gate voltages. FIG. 6B illustrates $I_{sd}$ vs. gate voltage ($V_g$) recorded for a typical device plotted on linear scales at a $V_{sd}$ of 2 V. FIG. 6C includes a histogram of the threshold voltage ($V_{th}$) determined from analysis 15 randomly chosen devices. FIG. 6d includes a histogram of $I_{on}$ showing the uniform device characteristics, as concluded from 15 randomly chosen devices.

Drain current ($I_{ds}$) versus drain-source voltage ($V_{ds}$) curves of spray-coated Si NW arrays were obtained by utilizing a sweeping voltage range from 0 V to +2 V at various gate voltages ($V_{gs}$), as shown in graphs 601 of FIG. 6A.

The two-terminal current versus drain-source voltage ($I_{ds}$-$V_{ds}$) curves showed a typical accumulation mode of p-channel transistor behavior. The plot of $I_{ds}$ versus $V_{gs}$ (FIG. 6B) at a constant $V_{ds}$=+2V showed a small current when the $V_{gs}$ was more positive than a threshold voltage ($V_{th}$).

Furthermore, it was shown that the $I_{ds}$ increased nearly linearly when the $V_{gs}$ increased in the negative direction. Extrapolation of the linear region resulted in a $V_{th}$=4.15 V. The slope in the linear region of $I_{ds}$ versus $V_{gs}$ gave a transconductance, =$dI_{ds}/dV_{gs}$, of 0.013 µS at $V_{ds}$=2V. The on-currents ($I_{on}$) of these devices were as high as 0.55 µA and the on-off current ratio was nearly $10^5$.

The electrical features of the Si NW FET devices were satisfactorily reproducible from sample-to-sample and from batch-to-batch. Indeed, randomly selected Si NW FETs showed well-constrained $V_{th}$ and $I_{on}$ behavior, with values of 4.26±1.10 V and 0.66±0.22 µA, respectively as illustrated by graphs 603 and 604 of FIGS. 6C and 6D.

The good reproducibility of the Si NW FETs can be attributed to the uniform density, good alignment and preferential distribution of the Si NWs, which, in turn, allows reproducible fabrication.

It has been shown that that spray-coating of Si NW suspensions under controlled temperature and air-flow conditions is a general approach for preparing well-aligned and controlled-density Si NW arrays. Arguably, the transfer of highly aligned and controlled-density Si NWs to both large crystalline and flexible plastic substrates provides important advances towards realizing technological implementation of these materials in several areas of electronics and/or biosensors. The quality and reproducibility of the spray-coated Si NW arrays was expressed by the production of highly uniform Si NW FETs.

Figure 7A:
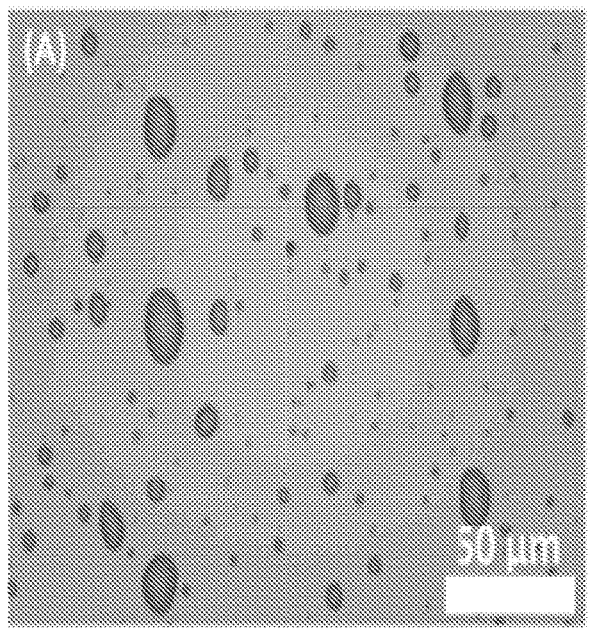
FIGS. 7A-7D include images of droplets and of nano-wire arrays according to an embodiment of the invention.
Figure 7B:
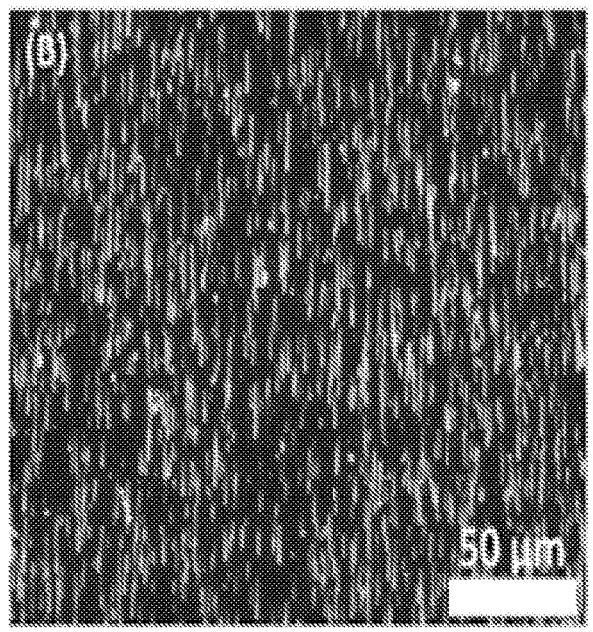
Figure 7C:
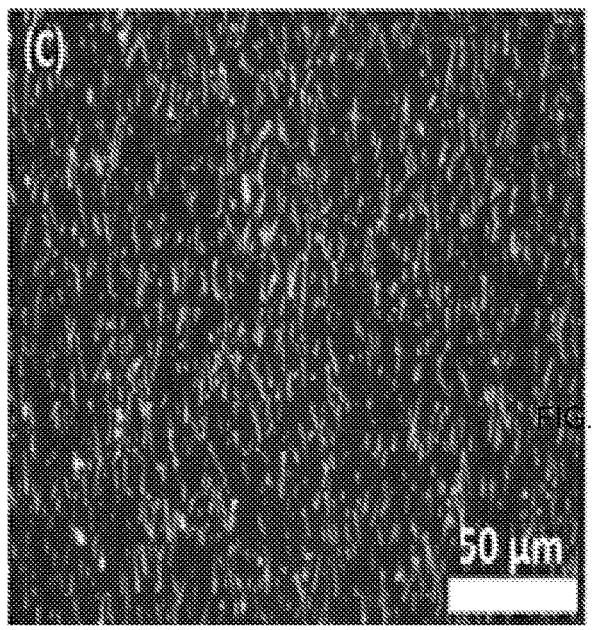
Figure 7D:
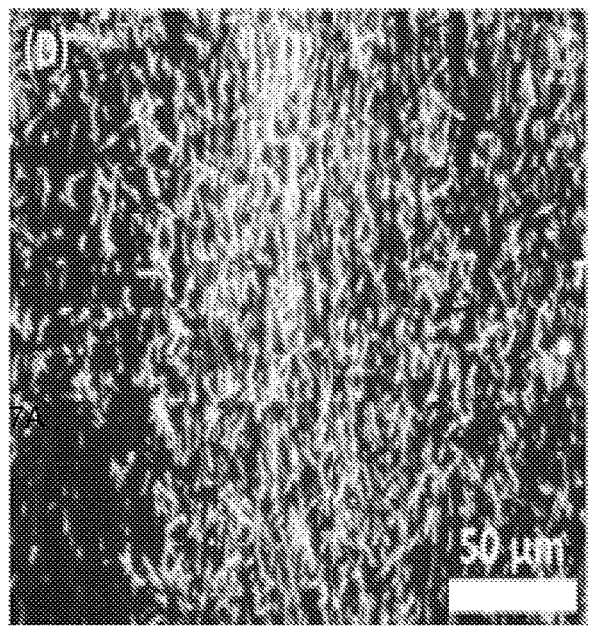

FIG. 7A is an optical microscopy image shows the mean distribution of the droplets diameter. FIGS. 7B, 7C and 7D are optical microscopy images that show the effect of increasing the droplet volume on the uniformity of the Si NWs alignment, respectively.

Figure 8:
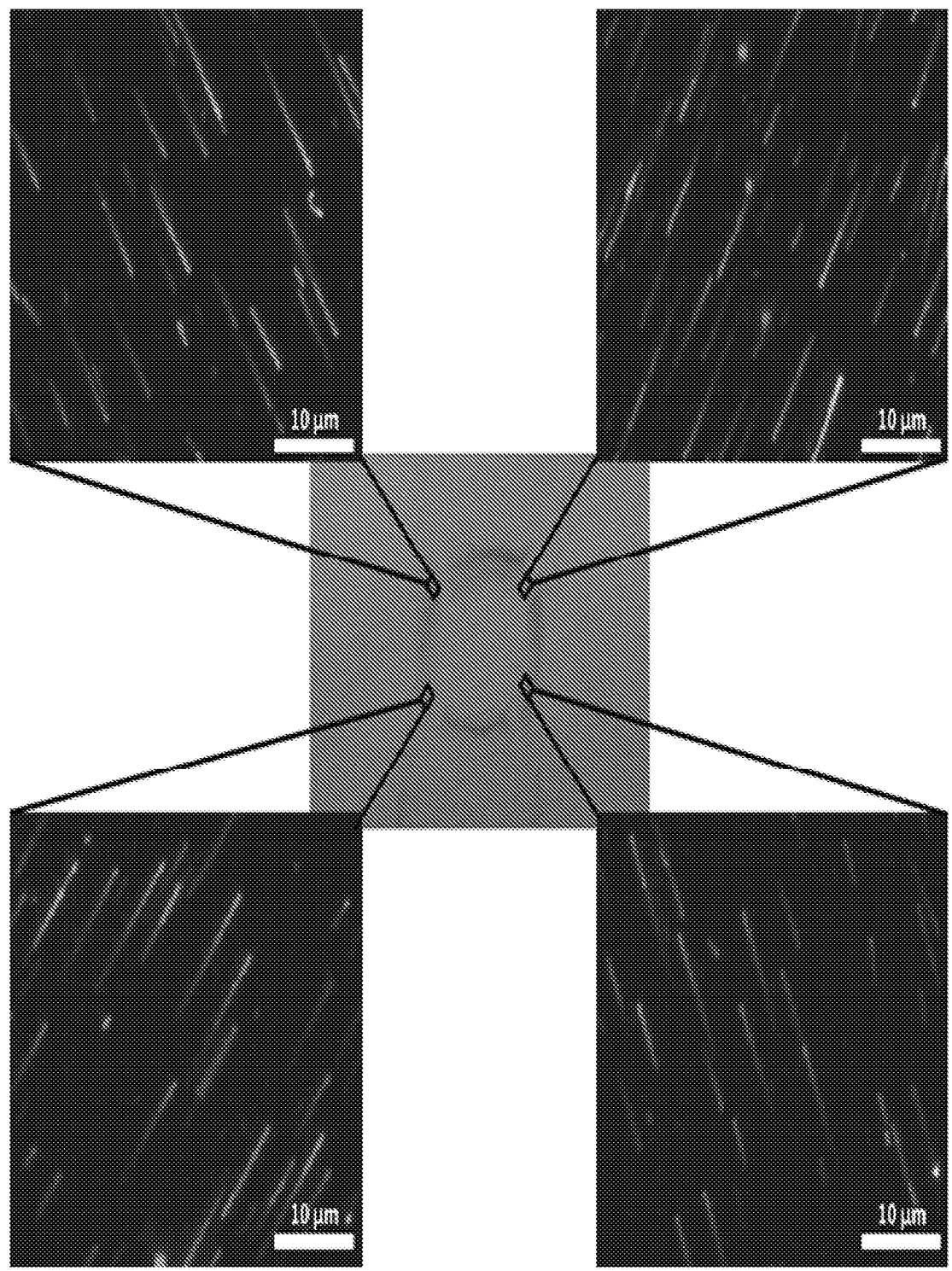
FIG. 8 includes various images of nano-wire arrays according to an embodiment of the invention.

FIG. 8 illustrates spray coating of Si NWs at 90° angle between the spray gun and the receiver substrate.

Figure 9:
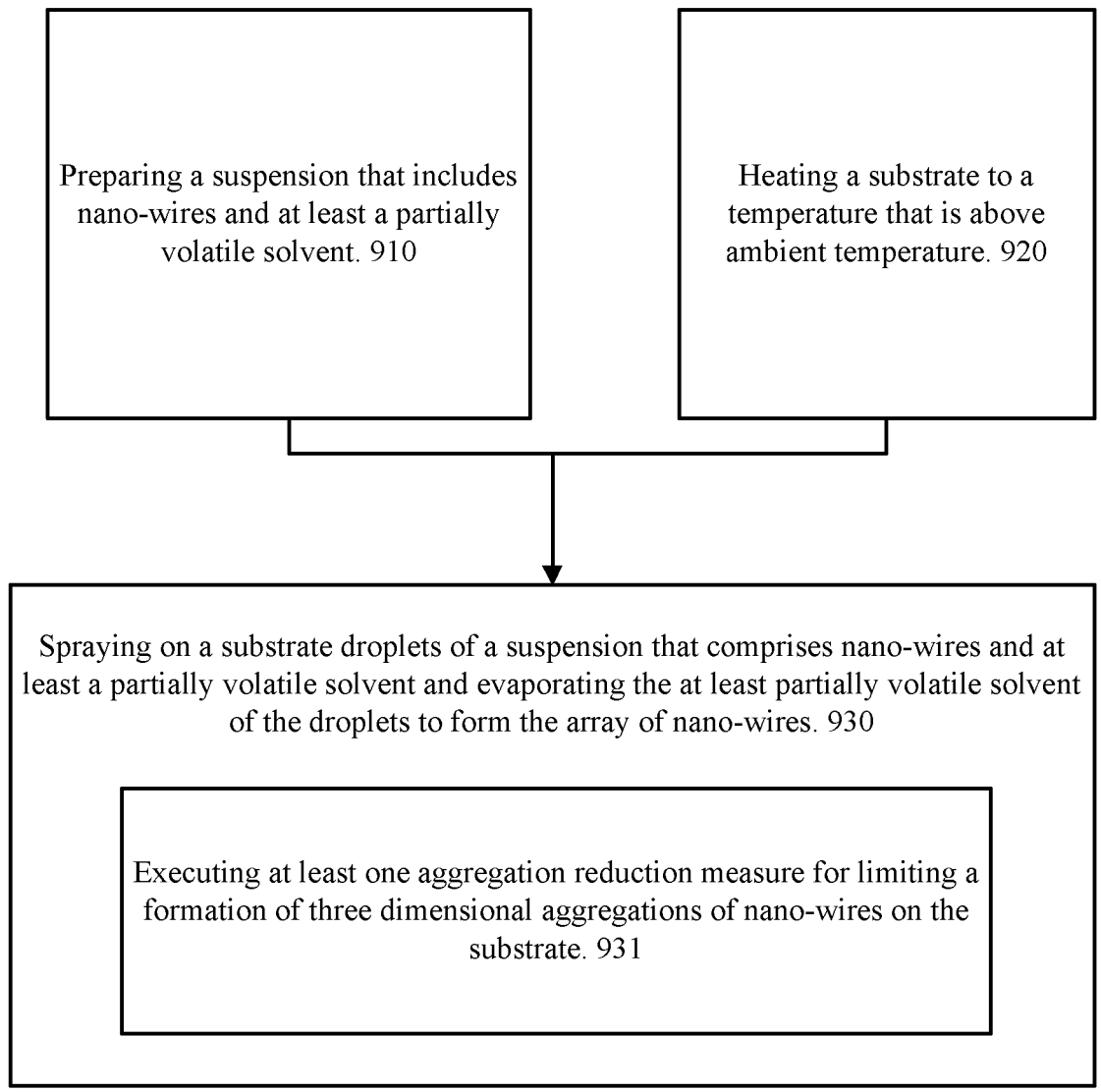
FIG. 9 illustrates a method according to various embodiments of the invention.

FIG. 9 illustrates method 900 according to an embodiment of the invention.

Method 900 may start by stage 910 of preparing a suspension that includes nano-wires and at least a partially volatile solvent.

Stage 910 may include growing nano-wires on a donor substrate and harvesting the nano-wires to provide a suspension. The suspension may include nano-wires and an at least partially volatile solvent. According to an embodiment of the invention the solvent can also include functional organic molecules in the solvent. These functional organic molecules can be attached to the nano-wires in the solvent.

Alternatively, the donor substrate can be placed in a solution of the organic molecules. Then the organic molecules can adsorb the NWs. The nano-wires can be detached from the donor substrate before being sprayed.

Method 900 may also include stage 920 of heating a substrate to a temperature that is above ambient temperature. The substrate is heated so that during the spraying (stage 930) droplets contact a heated substrate and their evaporation can be speeded up.

Stage 920 may include at least one of the following: (a) heating the substrate to a temperature that is closer to a boiling temperature of the volatile solvent than to an ambient temperature, (b) heating the substrate to a temperature that differs by up to twenty degrees to a boiling temperature of the volatile solvent, (c) heating the substrate to a temperature that substantially equals to a boiling temperature of the volatile solvent, or (d) heating the substrate to a temperature that guarantees that most droplets evaporate before nano-wires of different droplets contact each other.

According to another embodiment of the invention the substrate can be cooled instead of being heated so that droplets are frozen as a result of a contact with the substrate. The freezing of the droplets also reduced the mobility of the droplets and limits the formation of three dimensional aggregations of nano-wires. Once an area of the substrate is coated with frozen droplets the frozen droplets can be heated by a heating process that evaporates the solvent but maintains the droplets relatively static. This can be implemented by directing a pulse of heat radiation towards the droplets and the substrate.

Stages 910 and 920 may be followed by stage 930 of spraying on a substrate droplets of a suspension that comprises nano-wires and at least a partially volatile solvent and evaporating the at least partially volatile solvent of the droplets to form the array of nano-wires.

Stage 930 includes stage 931 of executing at least one aggregation reduction measure for limiting a formation of three dimensional aggregations of nano-wires on the substrate.

This at least one aggregation reduction measure can include spraying the droplets on a substrate that is heated (during stage 920) so that the droplets will evaporate before three dimensional aggregations are formed.

Additionally or alternatively, the at least one aggregation reduction measure can include controlling the amount of nano-wires per droplet- and limiting that amount to few nano-wires per droplet. Few may include less than 2, 3, 4, 5, 6, 7, 8, 9 or 10 or any number of such magnitudes.

Additionally or alternatively, the at least one aggregation reduction measure can include spacing the droplets form each other.

The at least partially volatile solvent can be a fully volatile solvent and stage 910 may include evaporating the volatile solvent to provide a substantially solvent free nano-wire array.

Stage 930 of spraying may include introducing pressure on the suspension by a carrier gas to form the droplets. The pressure can form the droplets and can induce a formation of an aligned nano-wire array.

According to an embodiment of the invention a spraying process can include spraying the droplets on one or more areas of the substrate. The parameters of the spraying process and/or of the substrate can be changed during the process to provide a nano-wire array that has portions that have different properties. Accordingly, stage 930 may include changing at least one parameter selected out of (a) a pressure applied during a coating of the area on droplets of the suspension, (b) an angle of spraying the suspension and (c) a distance between locations of contact between the substrate and adjacent. Stage 920 may include changing a temperature of the substrate.

This change can provide a nano-wire array having a varying alignment and, additionally or alternatively, have a varying density.

After the array of nano-wires is formed the process can continue by stage 510 of coupling different portions of the nano-wire array to different pairs of electrodes so that at least one pair of electrodes is coupled to a portion of the nano-wire array that differs by alignment and/or density from at least other pair of electrodes.

According to an embodiment of the invention the spraying can be responsive to feedback that can be provided in real time or off-line. Feedback can be provided by inspecting the nano-wires formed on the substrate and determining at least one property such as density and alignment. The parameters of the spraying process can be changed very quickly and thus allow real time adjustment of the spraying process.

The spraying process can be suitable to cover one or more areas of a substrate that form a three dimensional shape. The spraying process can guarantee that the alignment and/or density of the nano-wire array are maintained unchanged regardless of the shape of the substrate. Thus—the spraying process can be applied to substrates that cannot be covered in a uniform and property preserving manner by a layer of pre-fabricated nano-wires.

Thus, the spraying process can cover (with a nano-wire array) balls, elliptical shapes, can cover the entire substrate, can surround the entire substrate or most of the substrate with an array of nano-wires that maintains its properties despite substrate irregularities, edges, macro-scale (micron scale, millimeter scale and higher), despite the presence of concave surfaces, convex surface or combinations of convex and concave surfaces.

The method can provide a nano-wire array that is three-dimensional it may have multiple layers of nano-wires. The three-dimensional array of nano-wires may include multiple repetitions of a same two-dimensional nano-wire array.

Additionally or alternatively, the method may include forming the three-dimensional array of nano-wires so that the three-dimensional array of nano-wires may include multiple two-dimensional nano-wire arrays, wherein at least two two-dimensional nano-wire arrays differ from each other by shape and/or orientation.

Yet according to another embodiment of the invention the method may include forming the three-dimensional array of nano-wires so that the three-dimensional array of nano-wires may include multiple two-dimensional nano-wire arrays, wherein at least one two-dimensional nano-wire array exhibits uneven alignment or density.

Figure 10:
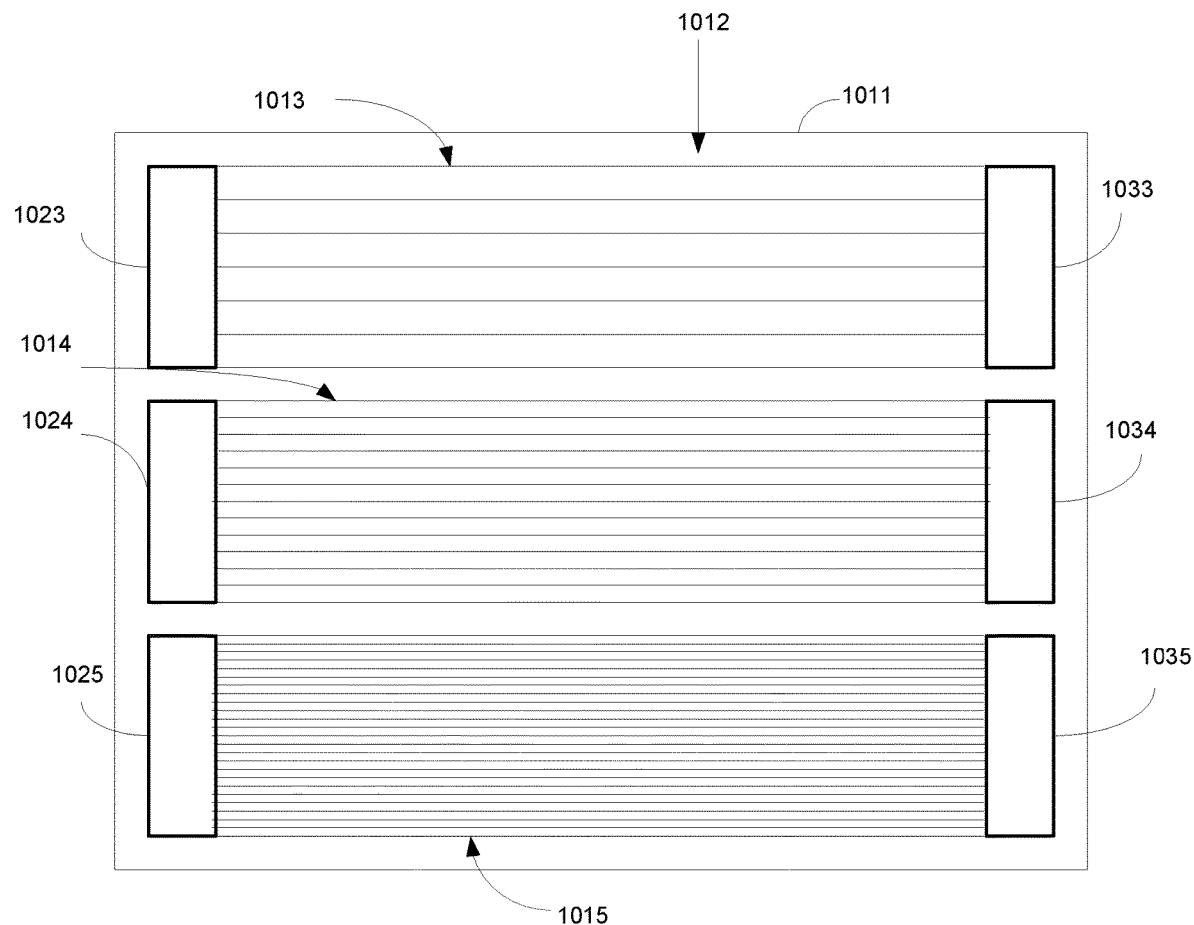
FIG. 10 illustrates a device according to various embodiments of the invention.

FIG. 10 illustrates a device 1010 according to an embodiment of the invention.

Device 1010 includes a substrate 1011 and a nano-wire array 1012 that contacts at least one surface of the substrate 1011. The nano-wire array 1012 includes different portions such as 1013, 1014 and 1015 that differ from each other by at least one of (a) an amount of alignment between the nano-wires, and (b) a density of nano-wires.

FIG. 10 also illustrates that each portion 1013, 1014 and 1015 of the nano-wire array 1012 is connected coupled between a pair of electrodes (1023, 1033), (1024, 1034) and (1025, 1035) respectively.

In any of the device mentioned in the specification the nano-wire array can include an array of substantially parallel nano-wires, multiple layers of two-dimensional nano-wire arrays that are parallel to each other or oriented to each other.

Figure 11:
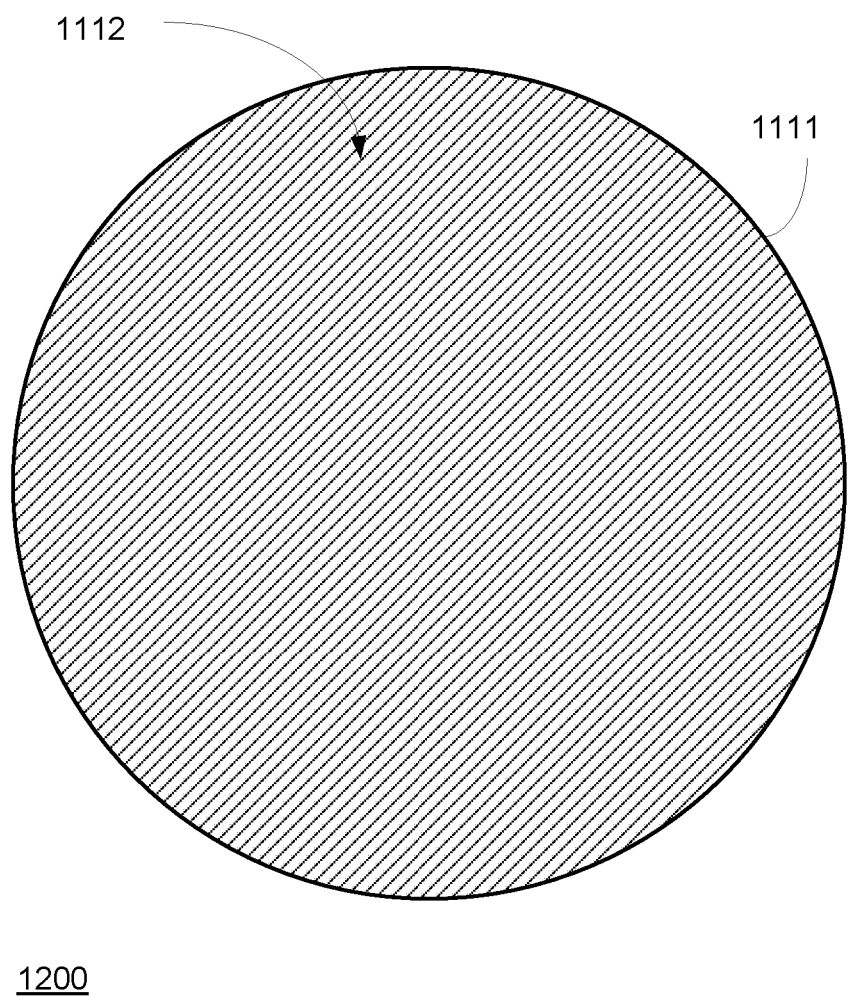
FIG. 11 illustrates a device according to various embodiments of the invention.

FIG. 11 illustrates a device 1100 according to an embodiment of the invention.

Device 1100 includes a three-dimensional substrate such as a ball shaped substrate 1111 and a nano-wire array 1112 that covers the entire substrate. Edges of the nano-wire array 1112 can be coupled between electrodes (not shown). It is noted that the nano-wire array 1112 may cover at least one half of the substrate 1112 while maintaining the same alignment and/or density across the entire covered area of the substrate.

Figure 12:
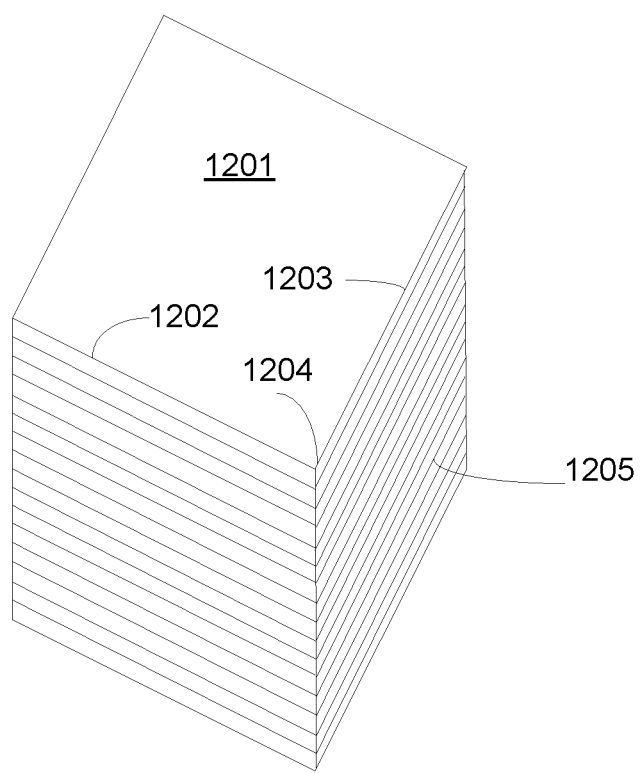
FIG. 12 illustrates a device according to various embodiments of the invention.

FIG. 12 illustrates a device 1200 according to an embodiment of the invention.

The device 1200 has a substrate 1201 of rectangular shape. At least two adjacent facets 1202 ad 1203 and the edge 1204 between these facets is coated with a nano-wire array 1205 that maintains its properties (alignment and/or density) over the edge. The nano-wire array direction of alignment can be parallel to the edge, can be normal to the edge or oriented in any other angle in relation to the edge.

Scaling Properties of Transistor Channels That Use Aligned Arrays of Si Nano-wires There may be provided Field effect transistors with an aligned array of non-wires that include different number of silicon nano-wire channels are fabricated. Channel number scaling effects on the performance of devices were illustrated. The results show that for field effect transistors with a threshold number of silicon nano-wires channels, on and off current ratio show better uniformity than equivalent devices with a lower number of silicon nano-wires.

The ability of nano-wires (NWs) to carry electrical current makes them promising building blocks in various nanoelectronic device concepts.

For technological applications, the ease and effectiveness with which NWs are assembled and integrated into large-scale devices are significant, making the use of aligned arrays of NWs (aligned array of NWs), which provide a scalable way to exploit the NW properties, critically important. Devices based on aligned array of NWs would: (i) permit controllable sensitivity, response and recovery times, and size of the device; (ii) yield a synergetic combination of the nanoscale and the macroscale worlds; and (iii) circumvent the requirement of position and structural control because the devices display average properties of many distributed NWs, so the aligned array of NWs could be processed into devices of arbitrary size using conventional micro-fabrication technology. Nevertheless, the low aligned array of NW stability, repeatability, and error tolerance are still a challenge for realizing such devices for real-world technological applications. To overcome these challenges, understanding the scaling properties of aligned array of NWs is of essential.

Studies have been carried out to explore the scaling effects of the channel length of filed effect transistor (FET) devices based on carbon nano-tubes (CNTs). However, less is known about the scaling effect of semiconducting NWs and even less about the scaling effect of the channel number. Here, we report on FETs with parallelly bridged aligned array of NWs and explore the impact of the channel number on the FET performance as well as the related fundamental parameters. As the representative semiconducting channel, we focus on silicon (Si) NWs, mainly due to their high potential for integration with existing Si microelectronics. The results indicate that, for arrays with a threshold number of Si NW channels, the aligned array of NW FET fundamental parameters, excluding the voltage threshold, show better uniformity than equivalent devices with a lower number of Si NWs. The results provide key insights into the behavior of the devices, the scaling of their properties, and directions for future work.

Figure 13:
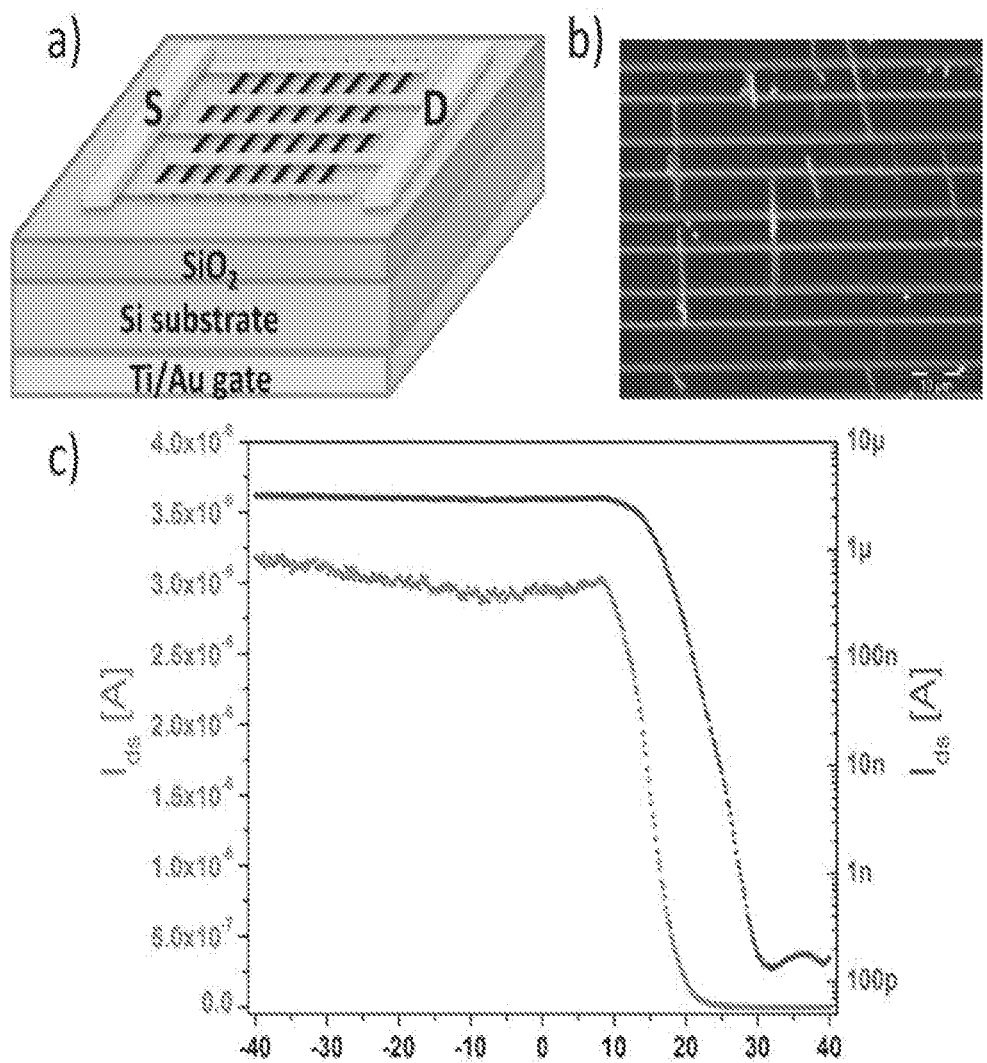
FIGS. 13-17 illustrate various properties of a field effect transistor that includes nano-wires according to an embodiment of the invention.

FIG. 13, sections (a) and (b) present a schematic structure and a microscope image of a typical Si aligned array of NW FET. As seen, Si NWs are aligned parallel to each other. No overlap between adjacent Si NWs was observed. FIG. 13c shows typical electrical characteristics of FET with 18 Si NW channels between source/drain (S/D) electrodes at room temperature. As seen from the figure, source-drain current ($I_{ds}$) exhibited well-behaved modulation with the applied gate voltage ($V_g$), indicating for p-type behavior. In this study, we define on-current ($I_{on}$) as $I_{sd}$ at $V_g$=−40V and the off-current ($I_{off}$) as $I_{ds}$ at $V_g$=+40V. At 2V source-drain voltage ($V_{ds}$), the $I_{on}$=3.18 µA, $I_{off}$=0.17 nA, and the $I_{on}/I_{off}$=1.9×10$^4$. The linear regime of the transconductance ($g_m$) is ~0.4 µS and the threshold voltage ($V_{th}$) is ~18.8V.

FIG. 13 illustrates: (a) Schematics of a FET with aligned array of Si NWs. (b) Optical image of FET with aligned array of Si NWs. (c) Linear scale (red point; left axis) and log scale (blue points; right axis) plots of $I_{ds}$ versus $V_g$ of a FET device with 18 bridged Si NW channels at $V_{ds}$=2 V.

To study the scaling effect of the Si NW channels, we have fabricated and measured 59FET devices with different numbers of bridged Si NWs, n.

Figure 14:
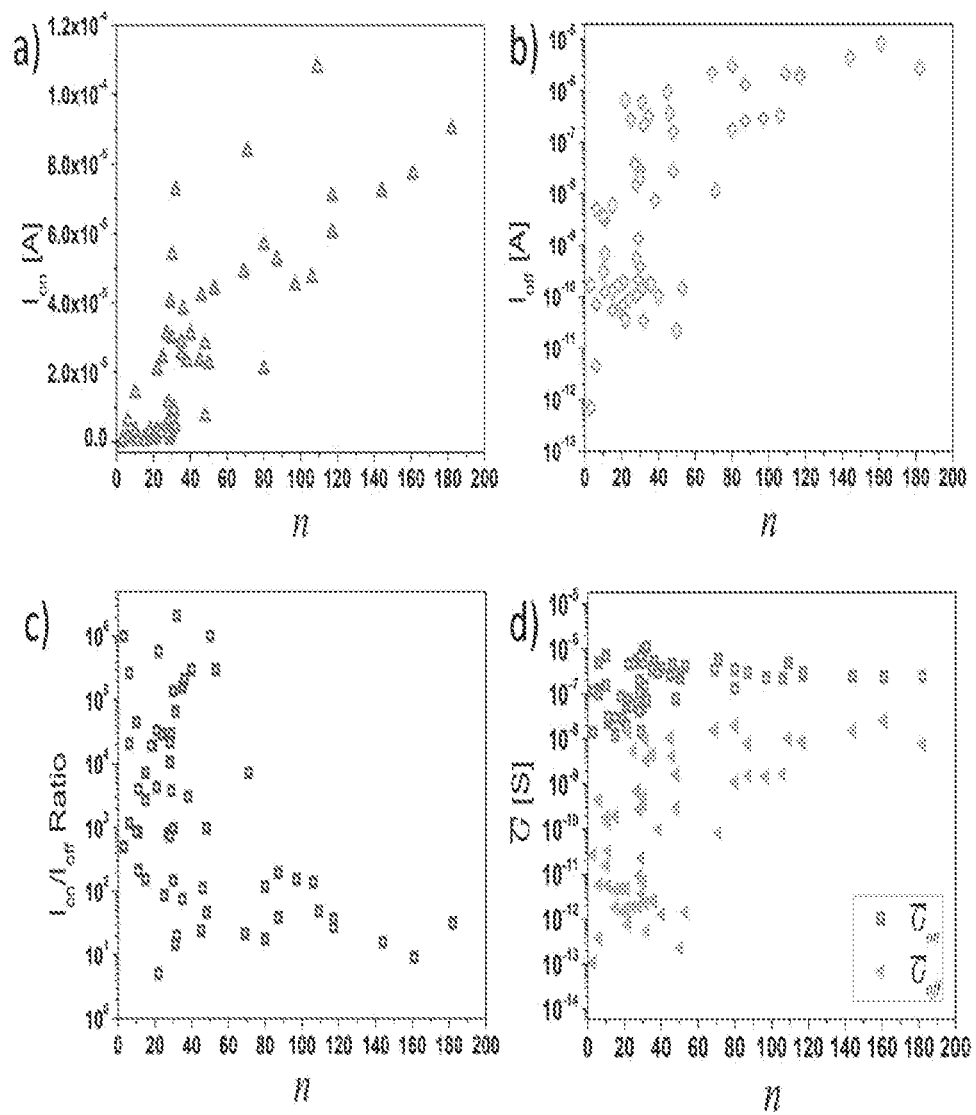

FIG. 14 presents the measured electrical signals ($I_{on}$, $I_{off}$ and $I_{on}/I_{off}$) as a function of n. As seen in the figure, the $I_{on}$ increased almost linearly with n, even though the variance at n<80 was higher than the variance at n>80. This trend is consistent with previous findings of other groups with aligned carbon nanotubes as well as Si NWs.

Unlike the $I_{on}$, the $I_{off}$ showed random distribution at 3≤n<80 (FIG. 14, section b). For n>80, the $I_{off}$ showed a trend with a positive slope. The $I_{on}/I_{off}$ showed random distribution in the region of 3≤n<80, with values ranging between 10$^1$ to 10$^7$ (FIG. 14, section c). In this region 83% of the devices exhibited $I_{on}/I_{off}$>10$^2$, while the rest exhibited $I_{on}/I_{off}$<10$^2$. For n>80, the $I_{on}/I_{off}$ showed a trend that converges to a fixed level. In this region, 33% of the devices exhibited $I_{on}/I_{off}$>10$^2$ and the rest (67%) of the devices exhibited $I_{on}/I_{off}$<10$^2$. No devices with $I_{on}/I_{off}$>10$^3$ were obtained in the region of n>80.

To further investigate the scaling effect of the Si NW channels, we have calculated average on-state conductance ($\overline{G}_{on}$) and off-state conductance ($\overline{G}_{off}$) per Si NW.

As seen in FIG. 14, section d, the $\overline{G}_{on}$ is distributed in a narrow interval ($10^{-8}$ to $10^{-6}$ S) for 3<n<30 and in a narrower interval for n>30. For the latter, the $\overline{G}_{on}$ approached a constant value of 3×$10^{-7}$ S. The $\overline{G}_{off}$ showed larger scattering than $\overline{G}_{on}$ and varied in a wide interval ($10^{-13}$ to $10^{-8}$ S) for 3<n<80 and in a narrow interval ($10^{-9}$ to $10^{-7}$ S) for n>80. Since the current is proportional to the conductance at a given $V_{ds}$, it can be inferred that $I_{on}/I_{off} = \overline{G}_{on}/\overline{G}_{off}$.

FIG. 14, sections (a)-(d) illustrate (A) $I_{on}$, (b) $I_{off}$, (c) $I_{on}/I_{off}$ ratio and (d) $\overline{G}_{on}$ and $\overline{G}_{off}$ as a function of n. All measurements were performed with $V_g$ sweeping from +40 to −40 V and with $V_{ds}$=2 V.

Figure 15:
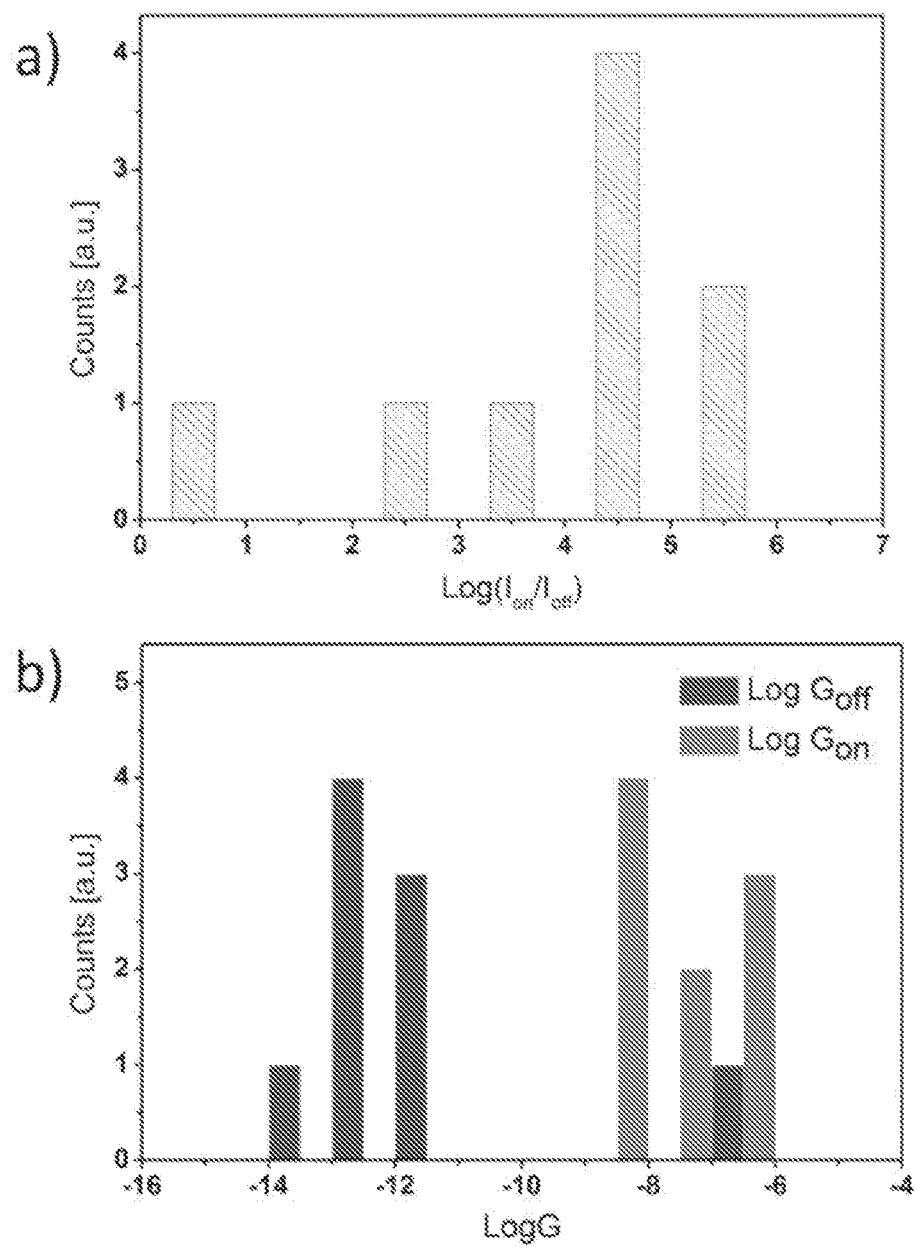

It is likely that the conductance of aligned array of NW FET devices is equal to the sum of individual NW FETs (i-NW FETs) that are connected in parallel. To validate this hypothesis, we have fabricated 19 Silicon i-NW FETs and measured their electrical characteristics. As shown in FIG. 15, section a, 88% of the Si i-NW FETs exhibited $I_{on}/I_{off}$>$10^2$ (hereon, Type-A Si NW) and 12% of the Si i-NW FETs exhibited $I_{on}/I_{off}$<$10^2$ (hereon, Type-B Si NW). FIG. 3, section b shows the distribution of the logarithmic values of $G_{on}$ (Log $G_{on}$) and $G_{off}$ (Log $G_{off}$) for the measured Si i-NW FETs. As seen in the figure, the Log $G_{on}$ had a mean value (μ) of −7.6 and a standard deviation (σ) of 0.97. The Log $G_{off}$ had a mean value of −11.6 and a standard deviation of 1.84. These observations indicate that $G_{off}$ and $I_{off}$ exhibit higher device-to-device variations than $G_{on}$ and $I_{on}$.

FIG. 15 is a histogram of the logarithmic value of (a) $I_{on}/I_{off}$ ratio, and (b) $G_{off}$ and $G_{on}$ of measured Si i-NW FETs.

A discussion of the electrical characteristics of the aligned array of NW FET devices by means of Si i-NW FETs is presented. This presentation can be described as a binomial sampling experiment. For this purpose, we use p and q=1-p to denote the probability of fabricated Si i-NW FETs that bridged with Type-A and Type-B Si NWs, respectively. Using these terms, the mean values of $G_{off}$ and $G_{on}$ of Si i-NW FETs, denoted by $\mu_{G_{off}}$ and $\mu_{G_{on}}$ are given by:

$$\mu_{G_{off}} = pG_{off}^A + qG_{off}^B \quad (1)$$

$$\mu_{G_{on}} = pG_{on}^A + qG_{on}^B \quad (2)$$

where $G_{off}^A$ is the $G_{off}$ of Type-A Si NW, $G_{off}^B$ is the $G_{off}$ of Type-B Si NW, $G_{on}^A$ is the $G_{on}$ of Type-A Si NW, and $G_{on}^B$ is the $G_{on}$ of Type-B Si NW.

Let n denote the total number of conducting channels in the aligned array of NW FET and lets k denote the number of channels that are bridged with Type-A Si NWs, where k=0, 1, 2, n. The probability that an arbitrary aligned array of NW FET device with n channels has Type-A Si NWs, denoted by p(k), is given by:

$$p(k) = \binom{n}{k} p^k q^{n-1} \quad (3)$$

where $$\binom{n}{k}$$

stands for the binomial coefficient.

The expectation of $G_{off}$ of with n channels $E(G_{off}^n)$, is computed as follows:

$$E(G_{off}^n) = \sum_{k=0}^{n} \binom{n}{k} p^k q^{n-k} [kG_{off}^A + (n-k)G_{off}^B] \quad (4)$$

$$= \sum_{k=0}^{n} \frac{n!}{k!(n-k)!} p^k q^{n-k} [k(G_{off}^A - G_{off}^B) + nG_{off}^B]$$

$$= n\mu_{G_{off}}$$

Similarly, the expectation of $G_{on}$ of with n channels $E(G_{on}^n)$, is computed as follow:

$$E(G_{on}^n) = n\mu_{G_{on}} \quad (5)$$

Thus, the $I_{on}/I_{off}$ ratio of the aligned array of NW FET device is:

$$\frac{I_{on}}{I_{off}} = \frac{E(G_{on}^n)V_{ds}}{E(G_{off}^n)V_{ds}} = \frac{\mu_{G_{on}}}{\mu_{G_{off}}} \quad (6)$$

For high n values, Eqs. (4)-(6) suggest that the $G_{off}$ and $G_{on}$ of aligned array of NW FET devices increase linearly with the number of the Si NW channels and that the $I_{on}/I_{off}$ ratio remains constant.

Using typical characteristics of Type-A Si NWs ($G_{on}$=$10^{-7}$ S, $G_{off}$=$10^{-12}$ S, and p=0.9) and Type-B Si NWs ($G_{on}$=$10^{-7}$ S, $G_{off}$=$10^{-8}$ S and q=0.1), Eq. (6) gives $I_{on}/I_{off}$=$10^2$ for n>80. This suggests that the $I_{on}/I_{off}$ ratio of aligned array of NW FET device with n>80 is highly dependent on Type-B Si NWs. In other words, to get high $I_{on}/I_{off}$ ratio aligned array of NW FET with n>80, one should remove or decrease the concentration of Type-B Si NWs. For the 3≤n<80, the random and highly distributed results indicate that Type-A Si NWs control the electrical characteristics of the aligned array of NW FET, more than Type-B Si NWs (see FIG. 14).

Figure 16:
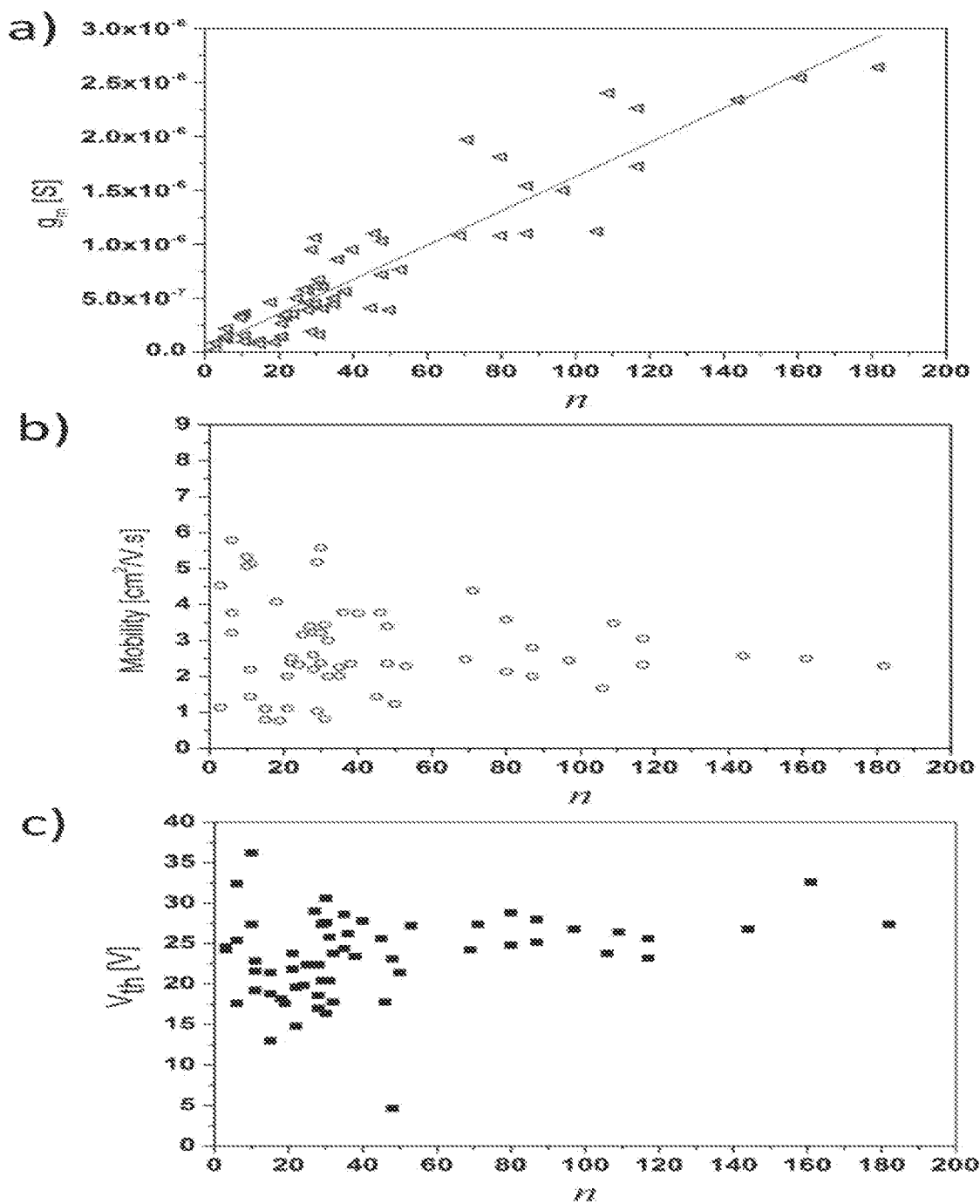

Apart from the scaling effect on the $I_{on}$, $I_{off}$ and $I_{on}/I_{off}$, we also studied the scaling effect of $g_m$, hole mobility ($\mu_h$) and $V_{th}$. As seen in FIG. 16 section a, $g_m$ increased almost linearly with n. The slope of the linear fit of this region(=15 nS), which provides the $g_m$ value per Si NW, was similar to the $g_m$ obtained from Si i-NW FET devices. This finding implies that the $g_m$ of the aligned array of NW FETs is additive.

The $\mu_h$ of single Si NW in aligned array of NW FETs was calculated using the following relationship:

$$\mu_h = \frac{g_m \ln[(2t_{ox} + R_{NW})/R_{NW}]}{2\pi\varepsilon_{ox}n} \frac{L_{NW}}{V_{ds}} \quad (7)$$

where $t_{ox}$ is the thickness of the gate oxide, $\varepsilon_{Dx}$ is the dielectric permittivity of the oxide, $R_{NW}$ is the radius of the Si NW, and $L_{NW}$ is the length of the channel.

The results are presented in FIG. 16, section b. As seen in the figure, the data points are symmetrically distributed with the center line of ~2.6 cm$^2$/V·s. In addition, the data points approached a fixed value as n increased. This observation suggests that increasing n can minimize the differences of $\mu_h$ among aligned array of NW FET devices, compared to i-Si NW FETs. Additionally, increasing n beyond a threshold value approaches the $\mu_h$ to a fixed level. The $V_{th}$ versus n plot (FIG. 16—section c) showed a wide distribution (5-36 V) that is not affected by the n value. This could be attributed to hysteresis in the electrical characteristics of the aligned array of NW FET (not shown), probably due to surface states (such as dangling bonds, defects, and adsorbates) variances between one Si NW and another.

Figure 17:
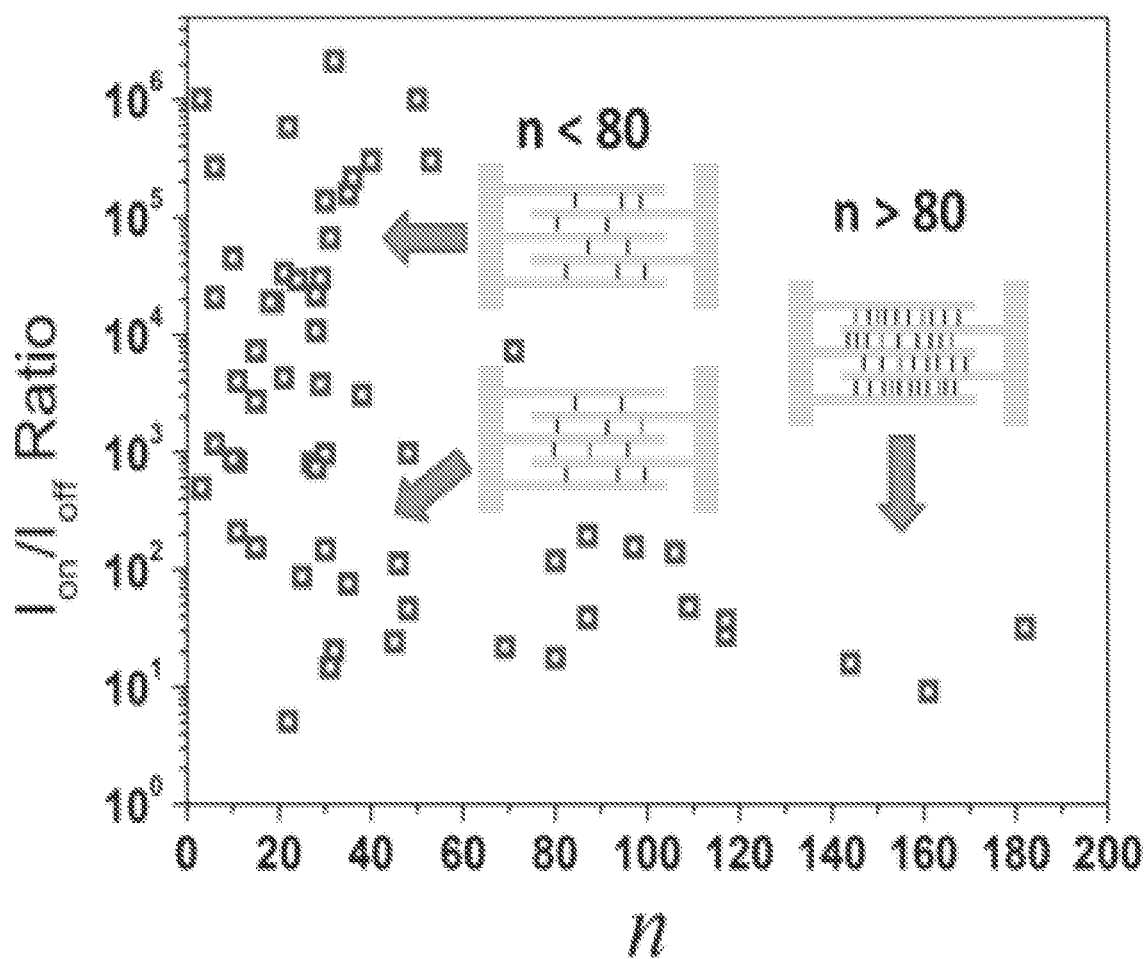

FIG. 17 shows (a)$g_m$, (b)$\mu_h$, and (c)$V_{th}$ as a function of bridged Si NW channel number (n).

To verify the additive nature of the $I_{on}$, $I_{off}$ and $g_m$ features, we carried out a parallel electrical connection between three Si aligned array of NW FET devices. The measured results are shown in Table 1. As shown in the table, the sum values of $I_{on}$, $I_{off}$ and $g_m$, of aligned array of NW FET devices before parallel connection (fourth row of the table) are similar to that after the parallel connection, thus confirming the additive nature of the Si NWs. Similar observations were obtained for the $I_{on}/I_{off}$ ratio.

TABLE 1

Summary of device performance before and after parallel connection of three Si NW aligned array of FETs

| | $I_{on}$ (A) | $I_{off}$ (A) | $I_{on}/I_{off}$ ratio | $g_m$ (S) |
|---|---|---|---|---|
| Device #1 | $2.27 \cdot 10^{-5}$ | $3.2 \cdot 10^{-8}$ | 709 | $8.34 \cdot 10^{-7}$ |
| Device #2 | $4.82 \cdot 10^{-5}$ | $1.34 \cdot 10^{-7}$ | 360 | $1.47 \cdot 10^{-6}$ |
| Device #3 | $5.88 \cdot 10^{-5}$ | $1.92 \cdot 10^{-6}$ | 30 | $1.73 \cdot 10^{-6}$ |
| Sum | $1.3 \cdot 10^{-4}$ | $2.09 \cdot 10^{-6}$ | 62 | $4.03 \cdot 10^{-6}$ |
| Parallel connected device | $1.01 \cdot 10^{-4}$ | $2.14E \cdot 10^{-6}$ | 47 | $4.16 \cdot 10^{-6}$ |

In summary, systematic study of channel number scaling in aligned array of NW FETs showed that a small number of bridged Si NW channels (3≤n<80) provide random device parameters. For high numbers of bridged Si NWs (n>80), the $I_{on}$ and $I_{off}$ increased linearly with n, while the $I_{on}/I_{off}$ ratio, $\mu_h$ and the $V_{th}$ were not affected by scaling effects of the channel number.

These results were explained by the fact that aligned array of NWs contain two main groups of Si NWs: a group with $I_{on}/I_{off}>10^2$ (Type-A Si NW), which controls the electrical characteristics for the case of 3≤n<80, and a group with $I_{on}/I_{off}<10^2$ (Type-B Si NW), which controls the electrical characteristics for the case of n>80.

These findings suggest that the uniform diameter, length and shape of a grown batch of Si NWs do not necessarily imply uniform electrical characteristics. Advanced growth processes of (electrically) homogenous Si NWs and/or advanced sorting techniques are therefore of critical importance for bringing the aligned array of NWs device concept to a reliable technological phase.

EXPERIMENT SECTION

P-type Si NWs with average diameters of 40±8 nm and lengths of 7-10 μm were grown on Si wafers by chemical vapor deposition using $SiH_4$ and $B_2H_6$ (1:20000 of B:Si ratio) as precursor gases and gold as a catalyst for the one dimensional NW growth.

The as-grown Si NWs were dispersed in ethanol, using ultra-sonication for 6 seconds. The Si NW solution was then spray coated, using a commercial spray gun, on a pre-cleaned p-Si(100) (0.001 Ω·cm resistivity) wafer with 300 nm thermal oxide and Ti/Au (10/200 nm) bottom gate electrode, that is placed on a 100° C. hot plate. The angle between spray flow direction and Si wafer plane was kept constant at 10±2° during the coating process. The density of the aligned Si NW arrays was controlled by the spray coating time. Source (S) and drain (D) Ti/Au (30/110 nm) contacts with a channel length of 2 μm were patterned using e-beam lithography for individual Si NWs and photolithography for arrays of Si NWs. A number of bridged Si NW channels between the source and drain electrodes of devices were evaluated in an optical microscope in dark field mode. A probe station that is connected to a device analyzer (Agilent B1500A) was used to collect the electrical signals of the Si aligned array of NW FETs. $I_{ds}$ versus voltage dependent back-gate ($V_b$) measurements, swept backwards between +40 V to −40V with 200 mV steps and at $V_{ds}$=2 V, were used to determine the performance of Si aligned array of NW FETs.

According to various embodiment of the invention there is achieved a high degree of alignment and controlled density of (Si) NWs. This is useful in a number of integrated electronic devices as well as in their constituent applications. To illustrate this potential, Si NW were spray coated on a 300 nm thermal oxide coated heavily doped p-type silicon wafer. The deposited Si NWs were then configured as back-gated field-effect transistors (FETs) by defining Ti/Au (40/110 nm) source (S) and drain (D) contacts with a channel length[46] of 2 μm channel width ranging from a single NW up to a channel width of 350 μm. The density of the connected Si NWs between the source and drain electrodes was similar for all channel widths (~1 NW/μm²). This density has been found to provide optimal performance as well as minimum variability across the device.

FIGS. 18A-18F illustrate various electrical characteristics of devices manufactured by spray coating Si NWs arrays with a density of about 1 nanowire per a square micron (1 NW/μm²) according to an embodiment of the invention.

FIG. 18A illustrates a family 1810 of source-drain current ($I_{ds}$) versus source-drain voltage ($V_{ds}$) plots at different gate voltages according to an embodiment of the invention.

FIG. 18B illustrates curves 1820 that represent $I_{ds}$ versus gate voltage ($V_g$) recorded for a typical device plotted on linear scales at $V_{ds}$=2 V according to an embodiment of the invention.

FIG. 18C illustrates a histogram 1830 of the threshold voltage ($V_{th}$) determined from analysis of 15 randomly chosen devices according to an embodiment of the invention.

FIG. 18D illustrates a histogram 1840 of on-current ($I_{on}$) showing the uniform device characteristics, as concluded from 15 randomly chosen devices according to an embodiment of the invention.

Figures 18E, 18F:
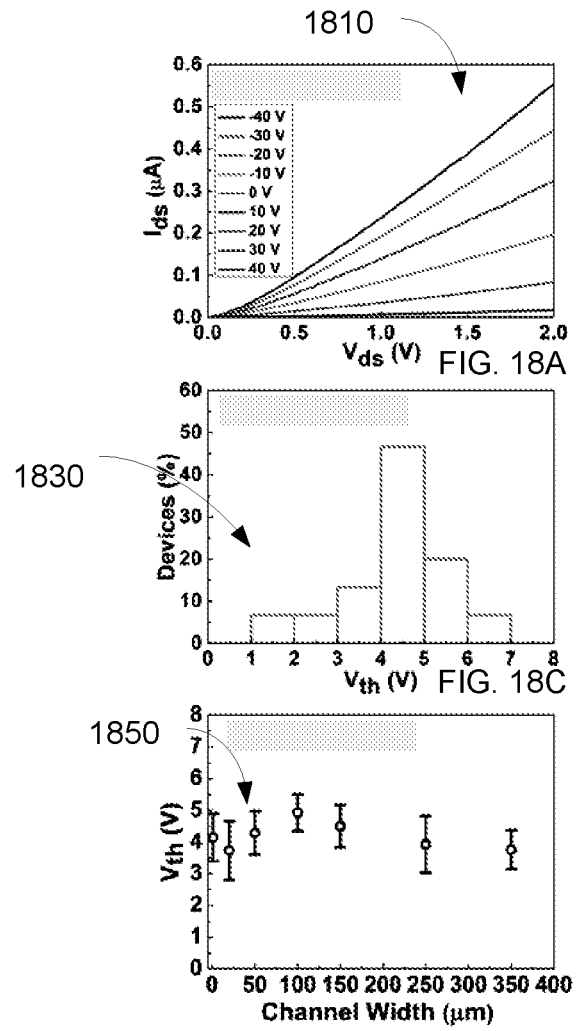

FIG. 18E illustrates curves 1860 representative of $I_{on}$ as a function of the channel width; and (F) $V_{th}$ as a function of the channel width.

FIG. 18A shows the drain current ($I_{ds}$) versus drain-source voltage ($V_{ds}$) curves of spray-coated Si NW arrays (~20 Si NWs) by utilizing a sweeping voltage range from 0 V to +2 V at various gate voltages ($V_g$s). As seen in the figure, the two-terminal current versus drain-source voltage ($I_{ds}$-$V_{ds}$) curves exhibited a typical accumulation mode of p-channel transistor behavior. The plot of $I_{ds}$ versus $V_{gs}$ (see FIG. 18B) at a constant $V_{ds}$=+2V exhibited a small current when the $V_{gs}$ was more positive than a threshold voltage ($V_{th}$). The $I_{ds}$ increased linearly with increasing the $V_{gs}$ in the negative direction and provided $V_{th}$=4.15 V. The slope in the linear region of the $I_{ds}$ versus $V_{gs}$ gave a transconductance, $g_m$=d$I_{ds}$/d$V_{gs}$, of 0.013 μS at $V_{ds}$=2V. The on-currents ($I_{on}$) of these devices were as high as 0.55 μA and the on-off current ratio was nearly $10^5$. The electrical features of the Si NW FETs were satisfactorily reproducible from sample-tosample and from batch-to-batch. Indeed, randomly selected Si NW FETs showed well-constrained $V_{th}$ and $I_{on}$ behavior, with values of 4.26±1.10 V and 0.66±0.22 µA, respectively (FIGS. 18C and 18D). The good reproducibility of the Si NW FETs can be attributed to the uniform density, the good alignment, and to the preferential distribution of the Si NWs.

FIG. 18E shows the average $V_{th}$ of different Si NW FETs as a function of the channel width—NOTE: The density of the sprayed Si NWs of all examined devices was similar to each other (1 NW/µm²). As seen in the figure, the $V_{th}$ showed a distribution that is not affected by the channel width, indicating that the $V_{th}$ is not affected by the number of Si NWs connected between the source and drain electrodes. This could be attributed to hysteresis in the electrical characteristics of the Si NW FET, probably due to variances in the surface states (such as dangling bonds, defects, and adsorbates) of the different Si NWs deposited on the substrate.

The average $I_{on}$ of the Si NW FETs as a function of the channel width is shown in FIG. 18F. It can be clearly seen that the $I_{on}$ linearly scales with the channel width with a slope of 0.04 µA/µm. Since a single Si NW in a back-gated geometry delivers ~0.04 µA (in average), the obtained 0.04 µA/µm slop in FIG. 18F can be corresponded with 1 NW/µm. The highly linear scaling of the $I_{on}$ with the channel width demonstrates the uniformity and reproducibility of the well-aligned NW arrays that are enabled through the reported spray-coating method.

There were also provided GaN devices that are prepared by the VLS growth technique with catalyst-free approach. The GaN nucleation layer was deposited at 1200° C. for 4 s with Ga:N ratio of 510:1. The GaN NWs were grown at 1150° C. for 1 h with Ga:N fluxes ratio of 68:1. Prior to use, the Si NWs and GaN NWs were cleaned by a sequential rinse with acetone, methanol, isopropanol, and dried by a stream of nitrogen.

The Ag NWs were produced via the polyol reduction of $AgNO_3$, in which ethylene glycol serves as the solvent and a precursor to the reducing agent. In addition to the use of poly(vinyl pyrrolidone) as a stabilizer, copper (II) chloride was added to the reaction to reduce the amount of free $Ag^+$ during the formation of initial seeds and scavenge adsorbed oxygen from the surface of the seeds once formed. In doing so, Ag nanowires were grown preferentially.

Figure 19A:
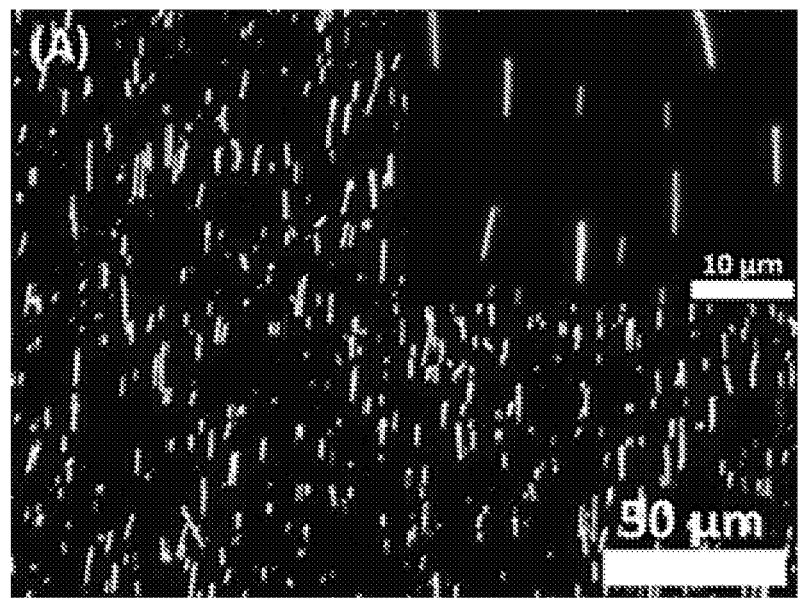
FIG. 19A is a dark-field optical image 1910 of a GaN NWs aligned by the spray flow on $SiO_x$/Si substrate according to an embodiment of the invention.

FIG. 19A is a dark-field optical image 1910 of a GaN NWs aligned by the spray flow on $SiO_x$/Si substrate according to an embodiment of the invention.

This high-resolution dark-field image highlights the alignment of individual GaN NWs.

Figure 19B:
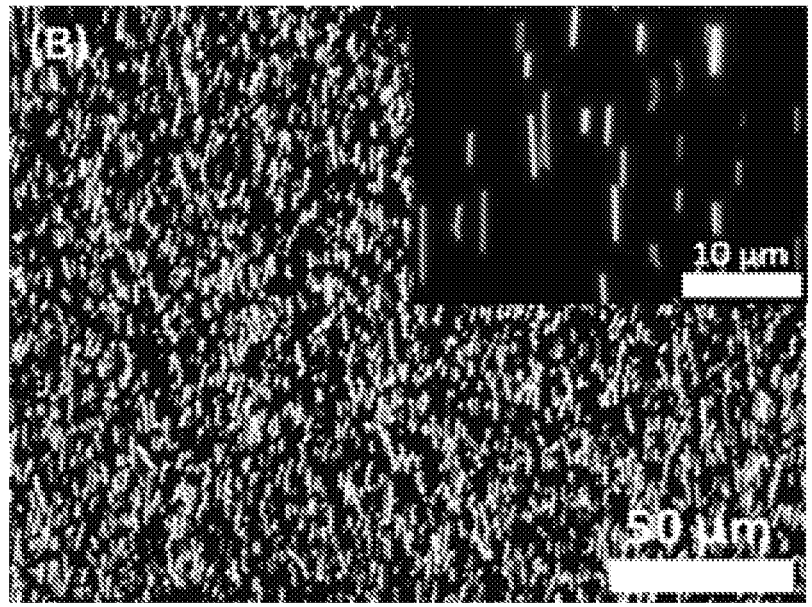
FIG. 19B is a dark-field optical image of spray-coated Ag NWs on $SiO_x$/Si substrate according to an embodiment of the invention.

FIG. 19B is a dark-field optical image 1920 of spray-coated Ag NWs on $SiO_x$/Si substrate according to an embodiment of the invention.

This high-resolution image showing aligned, individual Ag NWs. Both the GaN NWs and Ag NWs were suspended in isopropanol. All experiments were carried out with an air pressure of 40 psi and on receiver substrate at 75° C.

Figure 20:
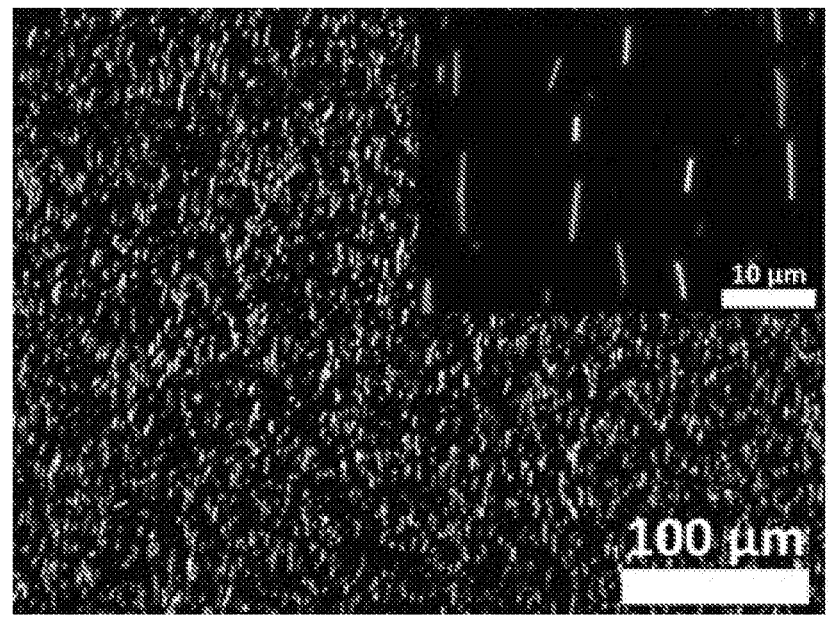
FIG. 20 is a dark-field optical image of spray-coated Ag NWs on a hydrophobic substrate (CF3-terminated SiOx/Si substrate) according to an embodiment of the invention.

FIG. 20 is a dark-field optical image 2010 of spray-coated Ag NWs on a hydrophobic substrate ($CF_3$-terminated SiOx/Si substrate) according to an embodiment of the invention. This magnified image shows the aligned Ag NWs. The Ag NWs were suspended in water. All experiments were carried out with an air pressure of 40 psi and on a receiver substrate at 75° C. The results demonstrate unequivocally that immobilization/alignment occurs primarily upon impact and does not necessitate the shear-driven spreading/elongation of the deposited droplets. In this case, the deposited (spherical) microdroplets slide along the surface without sticking to it and elongating in the flow direction. The dynamics of the droplet impact to the surface expected to be largely independent on the substrate type, chemistry and wettability of the substrate.

Surface Analysis of Bare and Molecularly Modified SiOx/Si Surfaces

X-Ray Photoelectron Spectroscopy (XPS)

All bare and molecularly modified SiOx/Si receiver substrates and Si NWs were characterized by high resolution X-ray Photo Electron Spectroscopy (XPS; Thermo VG Scientific, Sigma probe, England) having a base pressure of <3×10⁻⁸ torr and fitted with a monochromatized X-ray Al Kα (1486.6 eV) source to minimize the effect of X-ray damage to the sample. For maximum measurement sensitivity, a 100 W X-ray spot of 400 µm (in diameter) with pass energies of 150 eV was used for surface survey. All measurements were taken on the center of the sample to ensure reproducibility and to minimize the effects of scratches or contamination at the edges. Samples were scanned from 0 to 1000 eV to monitor signals for all surface elements. Data analysis was performed using the Sigma Probe Advantage software.

Figure 21B:
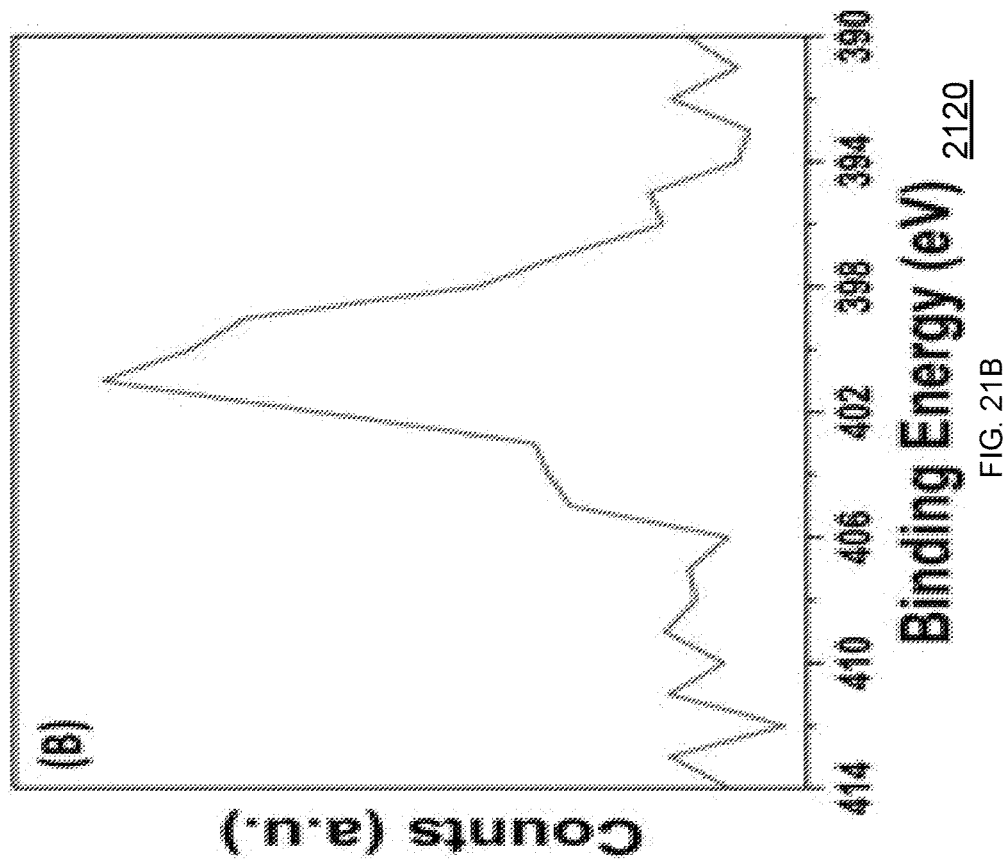
FIG. 21B illustrates a magnification of the Nls region (400.2 eV) of the 3-aminopropyltrimethoxysilane terminated surface according to various embodiments of the invention.
Figure 21A:
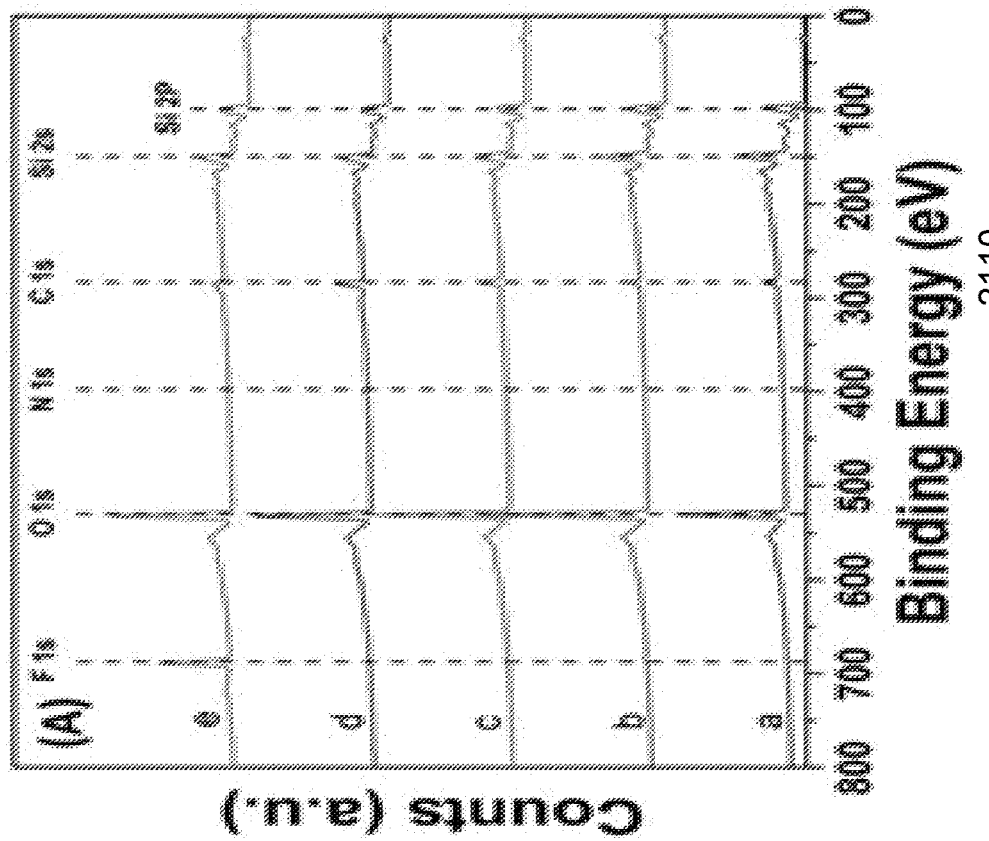
FIG. 21A illustrates a XPS survey spectra (1486.6 eV) for SiOx/Si surfaces according to various embodiments of the invention.

FIG. 21A illustrates a XPS survey spectra 2110 (1486.6 eV) for SiOx/Si surfaces according to various embodiments of the invention.

Spectrum-a represents bare SiOx/Si sample (untreated surfaces). Spectrum-b represents plasma-treated SiOx/Si surface for 30 min.

Spectrum-c represents trichlorooctadecylsilane-terminated surface.

Spectrum-d represents 3-amino-propyltrimethoxysilane-terminated SiOx/Si surface.

Spectrum-e represents 2-perfluorooctylethyltrichlorosilane-terminated SiOx/Si surface.

FIG. 21B illustrates a magnification 2120 of the N1s region (400.2 eV) of the 3-aminopropyltrimethoxysilane terminated surface according to various embodiments of the invention.

FIG. 21A presents typical survey-scan XPS data for bare and functionalized $SiO_x$/Si SiOx/Si receiver substrates. As seen in the figure, the untreated surface (Spectrum-a) exhibited peaks for elemental Si 2 s at 150 eV and Si 2p at 100 eV as well as Si phonon absorption bands at 17 eV and 36 eV, above the Si 2 s and Si 2p peaks. The same sample exhibited additionally C is peak at 284 eV and O is peak at 532 eV, indicating organic contamination of the bare, untreated $SiO_x$/Si surface. After plasma treatment (Spectrum-b), the amplitude of the C 1 S decreased, due to the removal of the organic condemnations, but the O is peak increased, due to the formation of new hydroxyl (OH) groups on the SiOx/Si surface. Trichlorooctadecylsilane-terminated SiOx/Si surface (Spectrum-c) exhibited attenuated Si(2p) and O(1 s) peaks and significantly higher C 1 s signals, compared to the plasma-treated SiOx/Si samples. The attachment of the 3-aminopropyltrimethoxysilane was verified by the presence of N1 s peak at 400.2 eV in the XPS survey scan, due to the —$NH_2$ functional group—see Spectrum-d in FIG. 1S(A) and FIG. 3S(B). The attachment of 2-perfluorooctylethyltrichlorosilane to the SiOx/Si surfaces was verified by the presence of F1 s peak around 688.0 eV in the XPS survey scan and by the presence of additional peak at 290.2 eV, due to the $CF_3$ functional group and $CF_2$ side groups (FIG. 3S(A), Spectrum-e). The XPS spectra of the molecularly modified Si NW samples exhibited similar characteristics to equivalent molecularly modified planar SiOx/Si samples.

Spectroscopic Ellipsometry

Ellipsometric spectra were recorded over a range from 250 1700 nm at five different incidence angles (60°, 65°, 70°, 75°, and 80°) using a spectroscopic phase modulated ellipsometer (M-2000 V Automated Angle, J. A. Woollam Co., Inc., USA). The thickness of the native oxide layer on the bare Si(111) samples, 14.9 Å, was determined through spectroscopic ellipsometry measurements on an open sample stage, prior to the silane functionalization, using tabulated values for the refractive indices of Si and $SiO_2$.[6,7] The hydroxyl-terminated oxide layer produced by treatment with plasma (50 W; 30 min) showed an average thickness of 22.1 Å, and was used as a reference sample for the functionalized surfaces.

The thicknesses of the molecular terminations were extracted by a three-phase monolayer/native oxide/Silicon model. Taking multiple readings and using the average value of the most consistent readings minimized errors in the thickness measurements. The extracted thicknesses confirmed the attachment of the molecular terminations on the SiOx/Si surface as well as the formation of a monolayer-thick molecular layer. Average thickness of 10.5±0.7 Å was obtained for trichlorooctadecylsilane, 5.5±0.5 Å for 3-aminopropyltrimethoxysilane, and 12.52±0.9 Å for 2-perfluorooctylethyltrichloro-silane. The measured thickness of the trichlorooctadecylsilane was found smaller than the theoretical value obtained by Density Functional Theory (DFT) calculations (22.2 Å). This discrepancy between experimental and calculated thicknesses for the surface covered can be ascribed due to moderate packing density of the molecules on the surface and/or due to inhomogeneous coverage at the surface.[8] The measured thicknesses of the aminopropyltrimethoxysilane and perfluorooctylethyltrichloro-silane were found to be in a good agreement with the DFT-based calculations (5.5 Å and 13.3 Å, respectively).

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Also for example, the examples, or portions thereof, may implemented as soft or code representations of physical circuitry or of logical representations convertible into physical circuitry, such as in a hardware description language of any appropriate type. Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for manufacturing an array of silicon nano-wires, the method comprises:
    spraying on a substrate droplets of a suspension that comprises silicon nano-wires and at least a partially volatile solvent; and
    evaporating the at least partially volatile solvent of the droplets to form the array of silicon nano-wires that comprises different portions that differ from each other by their desired density; wherein each portion of the different portions comprises evenly spaced apart silicon nano-wires that are parallel to each other;
    wherein two or more portions of the different portions differ from each other by alignment of silicon nano-wires; and
    wherein at least one of the spraying and the evaporating comprises executing at least one aggregation reduction measure for limiting a formation of three dimensional aggregations of silicon nano-wires on the substrate.

2. The method according to claim 1, wherein each droplet comprises few silicon nano-wires.

3. The method according to claim 1, wherein each droplet comprises up to five silicon nano-wires.

4. The method according to claim 1, wherein each droplet comprises up to two silicon nano-wires.

5. The method according to claim 1, wherein each droplet comprises up to a single silicon nano-wire.

6. The method according to claim 1, wherein the spraying comprises introducing pressure on the suspension by a carrier gas to form the droplets.

7. The method according to claim 1, wherein the spraying comprises introducing pressure on the suspension by a carrier gas to form the droplets and to induce a formation of an aligned silicon nano-wire array.

8. The method according to claim 1, comprising spraying the suspension on an area of substrate and intentionally changing at least one parameter between a spraying of a sub area on which a first portion of the array of silicon nanowires is formed and between a spraying of another sub area on which a second portion of the array of silicon nanowires is formed; wherein the sub-area and the other sub-area belong to the area; wherein the first portion of the array of nanowires and the second portion of the array of nanowires belong to the different portions; wherein the parameter is selected out of (a) a pressure applied during a coating of the area on droplets of the suspension, (b) a temperature of the substrate, (c) an angle of spraying the suspension and (d) a distance between locations of contact between the substrate and adjacent; to provide the silicon nano-wire array.

9. The method according to claim 8, comprising coupling the different portions of the silicon nano-wire array to different pairs of electrodes.

10. The method according to claim 8, comprising adjusting the at least one parameter in response to feedback indicative of a difference between a desired value of a property of a silicon nano-wire array formed by the spraying and an actual value of the property of the silicon nano-wire array.

11. The method according to claim 8, comprising spraying the suspension on the substrate while changing the pressure applied on the droplets of the suspension.

12. The method according to claim 8, comprising spraying the suspension on the substrate while changing the distance between locations of contact between the substrate and adjacent.

13. The method according to claim 1, comprising spraying the droplets on the substrate while the substrate is at a temperature that is closer to a boiling temperature of the volatile solvent than to an ambient temperature.

14. The method according to claim 13, comprising spraying the droplets on the substrate while the substrate is at a temperature that differs by up to twenty degrees from the boiling temperature of the volatile solvent.

15. The method according to claim 13, comprising spraying the droplets on the substrate while the substrate is at a temperature that substantially equals to the boiling temperature of the volatile solvent.

16. The method according to claim 1, comprising heating the substrate to a temperature that guarantees that most droplets evaporate before silicon nano-wires of different droplets contact each other.

17. The method according to claim 1 wherein the spraying and the evaporating provide an array of silicon nano-wires of variable density; wherein some silicon nano-wires of the array of silicon nano-wires are distributed at first density and some other silicon nano-wires of the array of silicon nano-wires are distributed at a second density that differs from the first density.

18. The method according to claim 1 wherein the spraying and the evaporating comprises executing the at least one aggregation reduction measure.

19. The method according to claim 1 wherein the at least one aggregation reduction measure comprises spacing the droplets from each other and controlling the amount of silicon nano-wires per droplet to less than ten silicon nano-wires.

20. A method for manufacturing an array of silicon nano-wires, the method comprises:
    spraying on a substrate droplets of a suspension that comprises silicon nano-wires and at least a partially volatile solvent;
    evaporating the at least partially volatile solvent of the droplets to form the array of silicon nano-wires that comprises different portions that differ from each other by their desired density; wherein each portion of the different portions comprises evenly spaced apart silicon nano-wires that are parallel to each other;
    a spraying the suspension on an area of substrate and intentionally changing a parameter between a spraying of a sub area on which a first portion of the array of silicon nanowires is formed and between a spraying of another sub area on which a second portion of the array of silicon nanowires is formed; wherein the sub-area and the other sub-area belong to the area; wherein the first portion of the array of nanowires and the second portion of the array of nanowires belong to the different portions; wherein the parameter is a temperature of the substrate; and
    wherein at least one of the spraying and the evaporating comprises executing at least one aggregation reduction measure for limiting a formation of three dimensional aggregations of silicon nano-wires on the substrate.

21. A method for manufacturing an array of silicon nano-wires, the method comprises:
- spraying on a substrate droplets of a suspension that comprises silicon nano-wires and at least a partially volatile solvent;
- evaporating the at least partially volatile solvent of the droplets to form the array of silicon nano-wires that comprises different portions that differ from each other by their desired density; wherein each portion of the different portions comprises evenly spaced apart silicon nano-wires that are parallel to each other;
- spraying the suspension on an area of substrate and intentionally changing a parameter between a spraying of a sub area on which a first portion of the array of silicon nanowires is formed and between a spraying of another sub area on which a second portion of the array of silicon nanowires is formed; wherein the sub-area and the other sub-area belong to the area; wherein the first portion of the array of nanowires and the second portion of the array of nanowires belong to the different portions; wherein the parameter is an angle of spraying the suspension; and
- wherein at least one of the spraying and the evaporating comprises executing at least one aggregation reduction measure for limiting a formation of three dimensional aggregations of silicon nano-wires on the substrate.

\* \* \* \* \*